US008188554B2

(12) United States Patent
Park

(10) Patent No.: US 8,188,554 B2
(45) Date of Patent: *May 29, 2012

(54) MEMORY DEVICE HAVING MOVABLE ELECTRODE AND METHOD OF MANUFACTURING THE MEMORY DEVICE

(75) Inventor: Jin-Jun Park, Seoul (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 1204 days.

This patent is subject to a terminal disclaimer.

(21) Appl. No.: 11/953,218

(22) Filed: Dec. 10, 2007

(65) Prior Publication Data

US 2008/0137404 A1 Jun. 12, 2008

(30) Foreign Application Priority Data

Dec. 12, 2006 (KR) .................. 10-2006-0126220

(51) Int. Cl.
*H01L 29/84* (2006.01)
*H01L 29/66* (2006.01)
*H01L 21/00* (2006.01)
*G11C 11/50* (2006.01)

(52) U.S. Cl. ......... 257/415; 257/252; 438/52; 365/164
(58) Field of Classification Search ............ 438/52; 257/252, 415; 365/164

See application file for complete search history.

(56) References Cited

U.S. PATENT DOCUMENTS

| 7,022,542 B2 * | 4/2006 | Combi et al. ............. 438/52 |
| 7,573,739 B2 * | 8/2009 | Yun et al. ............. 365/185.03 |
| 7,719,068 B2 * | 5/2010 | Lee et al. ............. 257/415 |
| 7,790,494 B2 * | 9/2010 | Kim et al. ............. 438/52 |
| 7,791,936 B2 * | 9/2010 | Lee et al. ............. 365/164 |
| 7,821,821 B2 * | 10/2010 | Lee et al. ............. 365/164 |
| 2004/0181630 A1 | 9/2004 | Jaiprakash et al. |
| 2005/0279988 A1* | 12/2005 | Bertin ................. 257/9 |
| 2007/0025138 A1* | 2/2007 | Furukawa et al. ........... 365/151 |
| 2007/0132046 A1* | 6/2007 | Yoo et al. ............... 257/415 |
| 2008/0198649 A1* | 8/2008 | Park ..................... 365/174 |
| 2009/0097315 A1* | 4/2009 | Yun et al. ............. 365/185.13 |

OTHER PUBLICATIONS

An english translation of a Korean Registered Patent for patent application No. 10-2004-0045258 (Publication date of Sep. 25, 2006).*

* cited by examiner

*Primary Examiner* — Nathan W. Ha
*Assistant Examiner* — Michael Jung
(74) *Attorney, Agent, or Firm* — Stanzione & Kim, LLP

(57) ABSTRACT

A memory device includes a bit line, a first word line, a bit line contact, an electrode, a second word line and a contact tip. The bit line may extend along a first direction. The first word line is formed over the bit line and extends in a second direction. The bit line contact is formed between adjacent first word lines. The bit line contact may have an upper face substantially higher than the first word lines. The electrode contacting with the bit line contact may include an elastic material bending by an electric field among the electrode, the first word line and the second word line. The second word line is disposed over the electrode and corresponds to at least one of the first word lines. The contact tip formed at a lateral portion of the electrode may protrude toward the first and the second word lines.

31 Claims, 33 Drawing Sheets

MEMORY DEVICE HAVING MOVABLE ELECTRODE AND METHOD OF MANUFACTURING THE MEMORY DEVICE

CROSS-REFERENCE TO RELATED APPLICATIONS

This application claims priority under 35 USC §119 from Korean patent application No. 2006-126220 filed on Dec. 12, 2006, the contents of which are herein incorporated by references in their entirety.

BACKGROUND OF THE INVENTION

1. Field of the Invention

The present general inventive concept relates to a memory device and a method of manufacturing a memory device. More particularly, the present general inventive concept relates to a memory device including a conductive material capable of being bent by an electric field and a method of manufacturing a memory device including a conductive material capable of being bent by an electric field.

2. Description of the Related Art

In general, memory devices may be divided into volatile memory devices and non-volatile devices. The volatile memory device, for example, a dynamic random access memory (DRAM) device or a static random access memory (SRAM) device, has a relatively fast response speed while losing data stored therein when an applied power is off. The non-volatile memory device such as an erasable programmable read only memory (EPROM) device or an electrically erasable programmable read only memory (EEPROM) device has a relatively slow response speed while maintaining data stored therein even though an applied power is off.

A conventional memory device includes a metal oxide semiconductor field effect transistor (MOSFET) manufactured by a metal oxide semiconductor technology. For example, the conventional memory device includes a stacked gate type transistor formed on a silicon substrate, or a trench gate type transistor buried in a silicon substrate. In the conventional MOSFET, a predetermined channel length and a channel width are ensured in order to prevent a short channel effect. Additionally, a gate insulation layer between a substrate and a gate electrode becomes considerably thin as a result of size reduction of the MOSFET. Thus, the conventional MOSFET may not be properly employed in a recent memory device having a critical dimension of nano meter.

Considering above-mentioned problems, novel devices have been developed instead of the conventional MOSFET. That is, a micro electromechanical system (MEMS) and a nano electromechanical system (NEMS) are applied for manufacturing novel semiconductor devices. For example, U.S. Patent Application Publication No. 2004/0181630 discloses a memory device including a carbon nanotube.

In the memory device according to the above U.S. patent application Publication, data may be stored or erased by contacting a carbon nanotube fabric with an upper electrode or a lower electrode. However, the conventional memory device including the carbon nanotube also has some problems as follows.

When the fabric of the carbon nanotube makes contact with the lower electrode, a high voltage is applied to the carbon nanotube fabric and the lower electrode so as to overcome a tension of the carbon nanotube fabric having lateral portions supported by a nitride layer on an insulating interlayer. Thus, a power consumption of the memory device may greatly increase.

Further, van der Waals forces may remarkably effect the carbon nanotube fabric and the lower electrode or the upper electrode when distances between the lower electrode and the carbon nanotube fabric or the upper electrode and the carbon nanotube fabric is maintained in nano scales. Accordingly, the lower electrode or the upper electrode may not easily separate from the carbon nanotube fabric due to attractive forces caused by the van der Waals forces after the carbon nanotube fabric makes contact with the lower electrode or the upper electrode. Accordingly, programming is deteriorated and operations are erased of the memory device.

Furthermore, predetermined charges are continuously supplied to the lower electrode and the carbon nanotube fabric or the upper electrode and the carbon nanotube fabric in order to maintain a contact state between the lower electrode and the carbon nanotube fabric or the upper electrode and the carbon nanotube fabric. Therefore, power consumption of the memory device may considerably increase. When the charges are not continuously supplied, the contact state between the lower electrode and the carbon nanotube fabric or the upper electrode and the carbon nanotube fabric may not be maintained such that the programming and erasing operations of the memory device may not be carried out.

SUMMARY OF THE INVENTION

The present general inventive concept provides a memory device stably operating at a relatively low power.

The present general inventive concept provides a method of manufacturing a memory device stably operating at a relatively low power.

Additional aspects and utilities of the present general inventive concept will be set forth in part in the description which follows and, in part, will be obvious from the description, or may be learned by practice of the general inventive concept.

The foregoing and/or other aspects and utilities of the general inventive concept may be achieved by providing a memory device including a first conductive line, a second conductive line, a contact, an electrode, a third conductive line and a contact tip. The first conductive line is disposed on a substrate, and the second conductive line is disposed over the first conductive line. The second conductive line may be electrically insulated from the first conductive line. The contact may be electrically connected to the first conductive line. The contact may have an upper face substantially higher than the second conductive line. The electrode may be electrically connected to the contact. The electrode may have at least one lateral portion extending in parallel to the second conductive line. Additionally, the electrode may include an elastic material bending by an electric field. The third conductive line is disposed over the electrode. The third conductive line may correspond to the first and the second conductive lines. The contact tip is disposed at the lateral portion of the electrode. The contact tip may protrude toward the second and the third conductive lines.

A first insulating interlayer may be formed between the first conductive line and the second conductive line. A second insulating interlayer may be additionally formed on the first insulating interlayer between adjacent second conductive lines.

A charge trapping structure may be disposed on the second conductive line. The charge trapping structure may include an oxide layer pattern, a charge trapping layer pattern and a dielectric layer pattern.

The foregoing and/or other aspects and utilities of the general inventive concept may also be achieved by providing a memory device including a bit line, a first word line, a bit line contact, an electrode, a second word line, and a contact tip. The bit line may extend on a substrate along a first direction. The first word line is formed over the bit line along a second direction substantially perpendicular to the first direction. The first word line may be electrically insulated from the bit line. The bit line contact is formed on the bit line between adjacent first word lines. The bit line contact may have an upper face substantially higher than the first word lines. The electrode is formed on the bit line contact. The electrode may have at least one lateral portion extending substantially in parallel to at least one of the first word lines. The electrode may include an elastic material bending by an electric field. The second word line is formed over the electrode. The second word line may extend along the second direction. The contact tip is formed at the lateral portion of the electrode. The contact tip may be protruded toward the first and the second word lines.

A first insulating interlayer may be formed between the bit line and at least one of the first word lines. A second insulating interlayer may be additionally formed on the first insulating interlayer between adjacent first word lines. Further, a third insulating interlayer may be formed on the electrode between adjacent second word lines.

Two of the second word lines may be formed over one of the first word line. Two of the contact tips may be formed at both lateral portions of the electrode.

The contact tip and the electrode may include titanium, titanium nitride or carbon nanotube used alone or in a mixture thereof.

A charge trapping structure may be formed on the first word line. The charge trapping structure may include an oxide layer pattern, a charge trapping layer pattern and a dielectric layer pattern.

The foregoing and/or other aspects and utilities of the general inventive concept may also be achieved by providing a method of manufacturing a memory device. In the method of manufacturing the memory device, a first conductive line is formed on a substrate. A second conductive line is formed over the first conductive line. The second conductive line may be electrically insulated from the first conductive line. A contact is formed on the first conductive line. The contact may have an upper face substantially higher than the second conductive line. An electrode is formed on the contact. The electrode may have at least one lateral portion extending in parallel to the second conductive line. The electrode may include an elastic material bending by an electric field. A contact tip is formed at the lateral portion of the electrode. The contact tip may protrude from the lateral portion of the electrode. A third conductive line is formed over the electrode. The third conductive line may correspond to the first and the second conductive lines.

In a formation of a charge trapping structure, an oxide layer pattern may be formed on the second conductive line, and then a charge trapping layer pattern may be formed on the oxide layer pattern. A dielectric layer pattern may be formed on the charge trapping layer pattern.

The foregoing and/or other aspects and utilities of the general inventive concept may also be achieved by providing a method of manufacturing a memory device. In the method of manufacturing the memory device, a bit line is formed on the substrate along a first direction. A first word line is formed over the bit line. The first word line may extend along a second direction substantially perpendicular to the first direction. A bit line contact is formed on the bit line between adjacent first word lines. The bit line contact may have an upper face substantially higher than the first word lines. An electrode is formed on the bit line contact. The electrode may include an elastic material bending by an electric field and the electrode may have at least one lateral portion substantially in parallel to at least one of the first word lines. A contact tip is formed at the lateral portion of the electrode. The contact tip may protrude from the lateral portion of the electrode. A second word line is formed over the electrode along the second direction.

A first insulating interlayer may be formed between the bit line and at least one of the first word lines. A first sacrificial layer pattern and a second sacrificial layer pattern may be formed on at least one of the first word lines. A second insulating interlayer may be formed on the first insulating interlayer between adjacent first word lines. The second insulating interlayer may have an upper face substantially higher than the first word lines.

A dimple may be formed at a portion of the second sacrificial layer pattern, and then a preliminary contact tip ma be formed to protrude from the dimple. A third sacrificial layer may be formed on the preliminary contact tip and the electrode. A fourth sacrificial layer may be formed on the third sacrificial layer. A conductive layer for the second word line may be formed on the fourth sacrificial layer. The conductive layer, the fourth sacrificial layer and the third sacrificial layer may be partially removed to form an opening. The third insulating interlayer may be formed in the opening. The conductive layer may be partially removed from a central portion of the preliminary contact tip to form a second word line over the electrode. The third and the fourth sacrificial layers may be removed, and then the preliminary contact tip may be partially removed to form the contact tip. Here, the third and the fourth sacrificial layers may be removed after forming the contact tip.

An oxide layer pattern may be formed on at least one of the first word lines, and a charge trapping layer pattern may be formed on the oxide layer pattern. Then, a dielectric layer pattern may be formed on a charge trapping layer pattern.

A contact tip may be provided on at least one lateral portion of an electrode such that a distance between a first word line and a second word line may be reduced. Therefore, a memory device having the electrode and the contact tip may operate at a low voltage, and thus memory device may have low power consumption. Additionally, a charge trapping structure may be provided on the first word line so as to maintain a contact state between the contact tip and the first word line by trapping charges in the charge trapping structure. Thus, data recorded in the first word line may be not erased without applying a voltage to the first word line, and thus the memory device may serve as a non-volatile memory device.

The foregoing and/or aspect and utilities of the general inventive concept may also be achieved by providing a memory device including a conductive line, an other conductive line disposed over the conductive line, and an electrode having a lateral portion disposed in a gap between the conductive line and the other conductive line to generate an electrical field with at least one of the conductive line and the other conductive line such that the lateral portion is bent toward the electrical field.

A contact tip may be formed on a distal end of the lateral portion of the electrode, having a thickness thicker than the lateral portion, and spaced apart from the first conductive line by a first distance and from the other conductive line by a second distance.

The contact tip may move to electrically contact one of the conductive line and the other conductive line according to a bending of the lateral portion.

The memory device may further include a substrate, a bit line formed on the substrate in a first direction, and a contact disposed between the electrode and the bit line to electrically connect the electrode and the bit line, wherein the conductive line is a first word line, the other conductive line is a second word line, the lateral portion moves to be electrically connected to one of the first word line and the second word line according to the electrical field.

The lateral portion may be extended from a center portion of the electrode spaced apart from the conductive line by a first distance and from the other conductive line by a second distance.

The lateral portion may be bent with respect to the center portion.

The foregoing and/or aspect and utilities of the general inventive concept may also be achieved by providing a method of manufacturing a memory device, the method including forming a conductive line, forming an other conductive line to be disposed over the conductive line to form an electrical field, and forming an electrode having a lateral portion disposed in a gap between the conductive line and the other conductive line to generate the electrical field with at least one of the conductive lines and the other conductive line to be bent by the electrical field.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
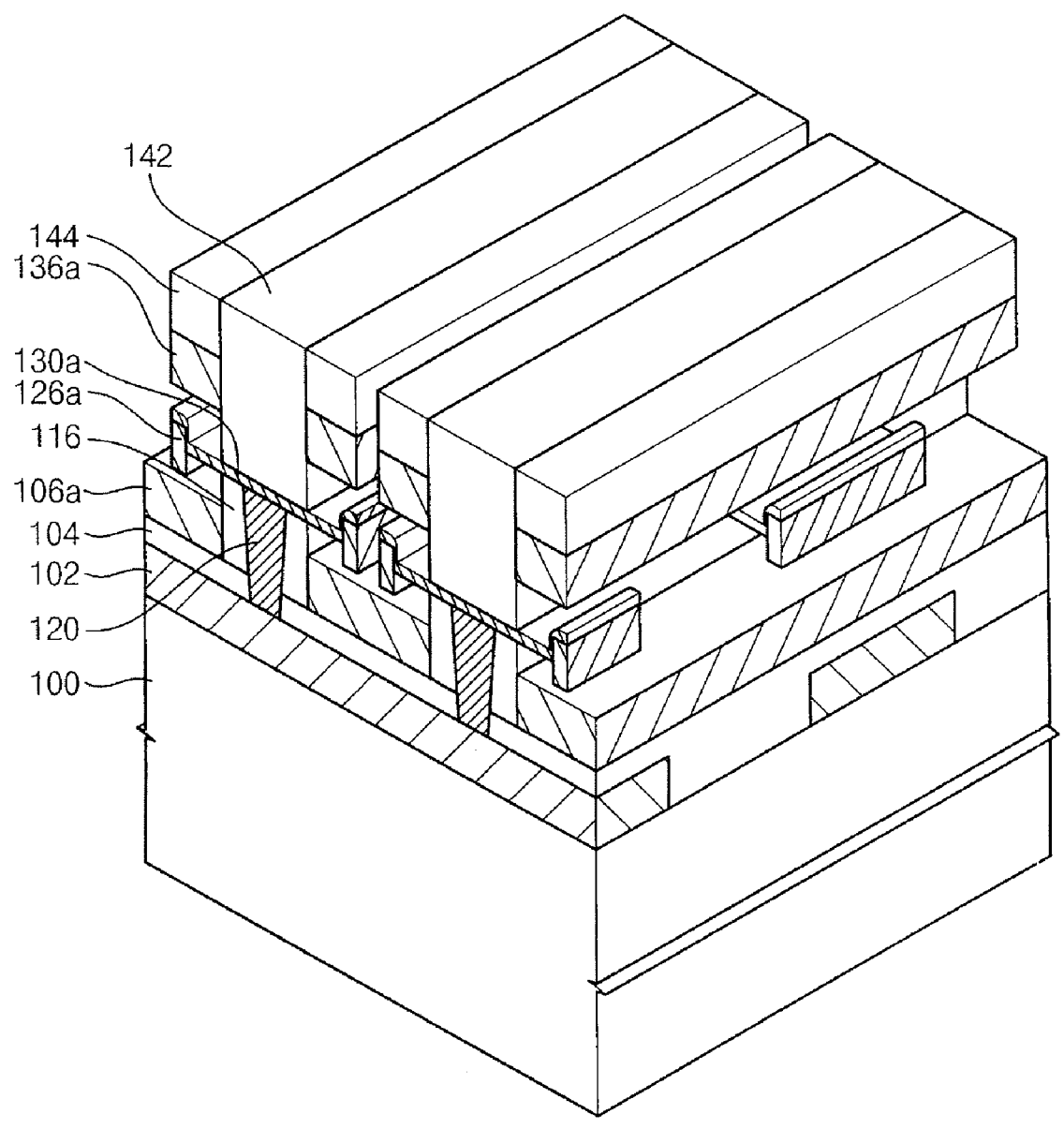
FIG. 1 is a perspective view illustrating a memory device in accordance with an example embodiment of the present general inventive concept.

Reference will now be made in detail to embodiments of the present general inventive concept, examples of which are illustrated in the accompanying drawings, wherein like reference numerals refer to the like elements throughout. The embodiments are described below in order to explain the present general inventive concept by referring to the figures.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present general inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present general inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, operations, elements, and/or components, but do not preclude the presence or addition of one or more other features, integers, operations, elements, components, and/or groups thereof.

The present general inventive concept are described herein with reference to cross-section illustrations that are schematic illustrations of idealized embodiments (and intermediate structures) of the present general inventive concept. As such, variations from shapes of the illustrations as a result, for example, of manufacturing techniques and/or tolerances, are to be expected. Thus, example embodiments of the present general inventive concept should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present general inventive concept.

Unless otherwise defined, all terms (including technical and scientific terms) used herein have the same meaning as commonly understood by one of ordinary skill in the art to which the present general inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a memory device according to an example embodiment of the present general inventive concept will be described in detail with reference to the accompanying drawings.

Figure 2:
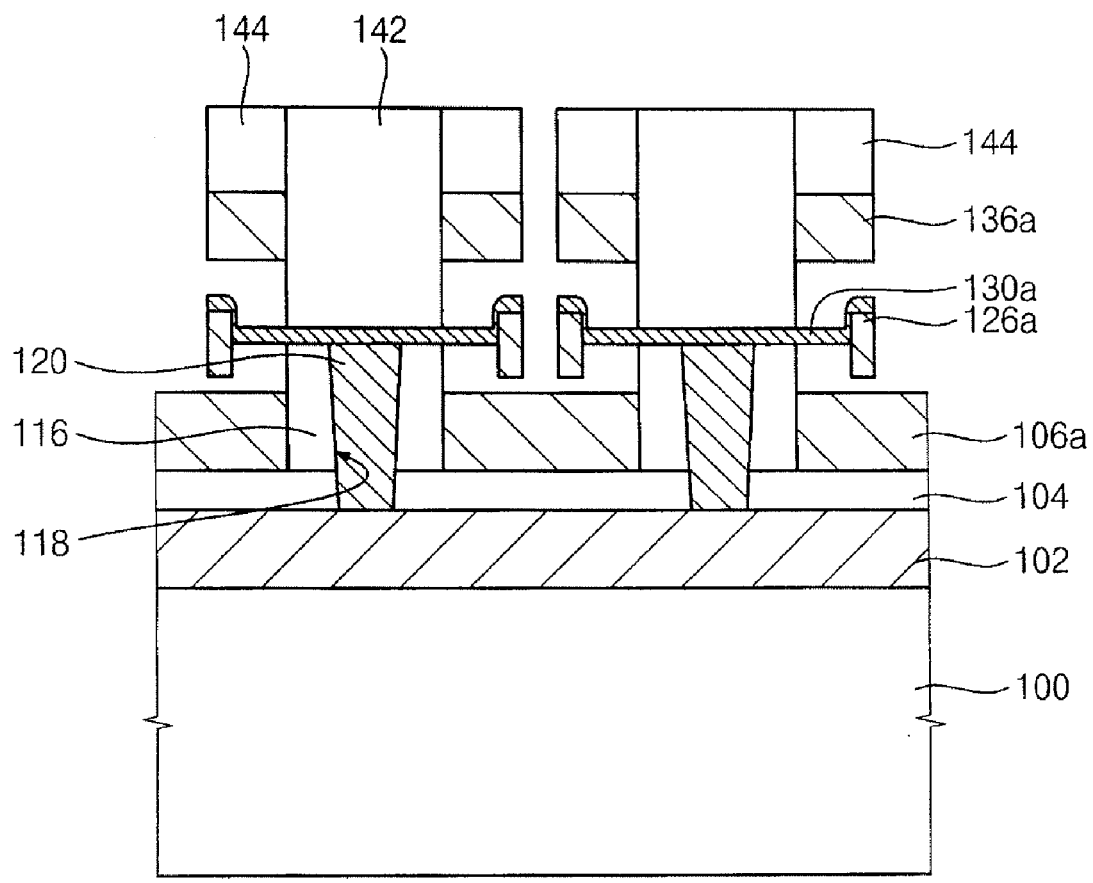
FIG. 2 is a cross-sectional view illustrating a memory device in accordance with an example embodiment of the present general inventive concept.

FIG. 1 is a perspective view illustrating a memory device in accordance with an example embodiment of the present general inventive concept. FIG. 2 is a cross-sectional view illustrating a memory device in accordance with an example embodiment of the present general inventive concept. In FIG. 1, "I" indicates a first direction and "II" denotes a second direction substantially perpendicular to the first direction (I). FIG. 2 illustrates a cross-section of the memory device taken along the first direction (I) in FIG. 1.

Referring to FIGS. 1 and 2, the memory device is provided on a substrate 100. The memory device includes a bit line 102, a first word line 106a, a bit line contact 120, an electrode 130a, a second word line 136a and contact tip 126a.

The substrate 100 may have a substantially level upper face. The substrate 100 may include an insulation substrate, a semiconductor substrate, a metal substrate, a metal oxide substrate, etc. Alternatively, the substrate 100 may have an insulation layer or an insulation structure formed thereon. For example, the substrate 100 may include a silicon-on-insulator (SOI) substrate, a germanium-on-insulator (GOI) substrate, etc. However, the substrate 100 may not have the insulation layer or the insulation structure when the substrate 100 includes the insulation substrate such as a glass substrate.

The bit line 102 is formed on the substrate 100. The bit line 102 may extend along the first direction (I). The bit line 102 may include a material having an electrical conductivity such as a metal, a metal compound or polysilicon doped with impurities. For example, the bit line 102 may include aluminum (Al), tungsten (W), titanium (Ti), tantalum (Ta), gold (Au), silver (Ag), copper (Cu), tungsten silicide ($WSi_x$), titanium nitride ($TiN_x$), tantalum silicide ($TaSi_x$), etc.

A first insulating interlayer 104 is formed on the substrate 100 to cover the bit line 102. The first insulating interlayer 104 may sufficiently fill up a gap generated between adjacent bit lines 102. The first insulating interlayer 104 may include an oxide such as silicon oxide. For example, the first insulating interlayer 104 may include undoped silicate glass (USG), tetraethylorthosilicate (TEOS), phosphor silicate glass (PSG), boro-phosphor silicate glass (BPSG), spin on glass (SOG), flowable oxide (FOX), high density plasma-chemical vapor deposition (HDP-CVD) oxide, etc. The first insulating interlayer 104 may have a level upper face substantially parallel to the substrate 100.

The first word line 106a is formed on the first insulating interlayer 104. The first word line 106a may extend along the second direction (II) substantially perpendicular to the first direction (I). The first word line 106a may cross over the bit line 102 while the first word line 106a is electrically insulated from the bit line 102 by the first insulating interlayer 104. The first word line 106a may serve as a writing word line or a reading word line. In example embodiments, the first word line 106a may serve as the writing word line to write data in the memory device. The first word line 106a may include a metal, a metal compound or doped polysilicon. For example, the first word line 106a may include aluminum, tungsten, tungsten silicide, titanium, titanium nitride, tantalum, tantalum silicide, gold, silver, copper, etc.

A second insulating interlayer 116 is formed on the first insulating interlayer 104 between adjacent first word lines 106a. That is, the second insulating interlayer 116 may fill up a gap between adjacent first word lines 106a. Further, the second insulating interlayer 116 may be protruded substantially higher than the first word line 106a. Thus, the second insulating interlayer 116 may have an upper face substantially higher than the first word line 106a. The second insulating interlayer 116 may also have a level upper face substantially parallel to the substrate 100. The second insulating interlayer 116 may include an insulation material such as an oxide. For example, the second insulating interlayer 116 may include silicon oxide such as USG, PSG, BPSG, SOG, FOX, HDP-CVD oxide, etc. In an example embodiment, the second insulating interlayer 116 may include an oxide substantially the same as the first insulating interlayer 104. In other example embodiments, the second insulating interlayer 116 may include an oxide substantially different from the first insulating interlayer 104.

A bit line contact hole 118 is formed through the second insulating interlayer 116 and the first insulating interlayer 104 to expose the bit line 102. The bit line contact 120 is formed on the bit line 102 to fill up the bit line contact hole 118. The bit line contact 120 locates between adjacent first word lines 106a. The bit line contact 120 may have an upper face substantially higher than the first word line 106a. The bit line contact 120 may include a metal, a metal compound or polysilicon doped with impurities. For example, the bit line contact 120 may include aluminum, tungsten, titanium, tantalum, silver, gold, tungsten silicide, titanium nitride, tantalum silicide, etc. The bit line contact 120 may have an area varying according to a distance from the bit line 102.

The electrode 130a is formed on the bit line contact 120 and the second insulating interlayer 116. In an example embodiment, the electrode 130a may have a central portion and lateral portions. The central portion of the electrode 130a may be positioned on the bit line contact 120 and the second insulating interlayer 116. At least one of the lateral portions of the electrode 130a may extend in a direction substantially parallel to the first word line 106a. That is, at least one of the lateral portions of the electrode 130a may locate over the first word line 106a. In an example embodiment, the electrode 130a may have a cantilever structure. For example, the lateral portion of the electrode 130a protrudes or extends from the second insulating interlayer 116 in the first direction (I).

The electrode 130a may include a conductive material having elasticity. Thus, at least one of the lateral portions of the electrode 130a may be bent in a predetermined direction when a voltage is applied to the electrode 130a. Examples of the conductive material used in the electrode 130a may include a metal such as titanium, a metal nitride such as titanium nitride, or other conductive material such as carbon. In an example embodiment, the electrode 130a may include a carbon nanotube. Here, the carbon nanotube in the electrode 130a may have a crystalline structure in which a plurality of hexagonal rings of carbon is connected to one another. The carbon nanotube in the electrode 130a may have a width of several nanometers to several tens of nanometers. The carbon nanotube may have an electrical conductivity substantially similar to copper, and may also have a thermal conductivity substantially similar to diamond. Further, the carbon nanotube may have a mechanical strength about one hundred times superior to steel. The carbon nanotube may also have elasticity considerably higher than carbon fiber. For example, the carbon fiber may be broken when the carbon fiber is extended by about 1 percent based on an original length thereof, whereas the carbon nanotube may tolerate a distortion of about 15 percents based on an original length thereof.

Adjacent electrodes 130a are isolated from each other by a predetermined interval. In an example embodiment, both of the lateral portions of the electrode 130a may extend substantially in parallel to the first word line 106a. The lateral portions of the electrode 130a may be bent toward the first word line 106a or the second word line 136a in accordance with an electric field generated between the first and the second word lines 106a and 136a. In other example embodiments, only one of the lateral portions of the electrode 130a may be bent toward the first word line 106a or the second word line 136a in accordance with the electric field. Here, the electrode 130a may have the cantilever structure.

The second word line 136a is formed over the electrode 130a and the first word line 106a. The second word line 136a is separated from the electrode 130a by a predetermined distance. The second word line 136a may be formed substantially in parallel to the first word line 106a. The second word line 136a may extend along the second direction (II). In an example embodiment, two of second word lines 136a may correspond to one of the first word line 106a. Adjacent second word lines 136a may be separated from each other by a third insulating interlayer 142 or by a predetermined interval. The second word line 136a may include a metal or a metal compound. For example, the second word line 136a may include gold, silver, copper, aluminum, tungsten, titanium, tantalum, tungsten silicide, titanium nitride, tantalum silicide, etc. In an example embodiment, the second word line 136a may serve as reading word lines to read data stored in the memory device.

In an example embodiment, the lateral portions of the electrode 130a may be bent toward the first word line 106a or the second word line 136a when the electric field is generated between the first and the second word lines 106a and 136a.

A hard mask 144 is formed on the second word line 136a. The hard mask 144 may include a material having an etching selectivity relative to the second word line 136a and/or the third insulating layer 142. For example, the hard mask 144 may include a nitride such silicon nitride.

The third insulating interlayer 142 is formed on the electrode 130a to provide a space between adjacent second word lines 136a. For example, the third insulating interlayer 142 may be positioned on the central portion of the electrode 130a. Additionally, the distance between the first and the second word lines 106a and 136a is ensured by the second insulating interlayer 116 and the third insulating interlayer 142. In an example embodiment, the second word line 136a may be attached to a sidewall of the third insulating interlayer 142 so that the second word line 136a may be supported by the third insulating interlayer 142. The hard mask 144 may be also attached to the sidewall of the third insulating interlayer 142. The third insulating interlayer 142 may include an oxide such as silicon oxide. For example, the third insulating interlayer 142 may include BPSG, PSG, SOG, USG, FOX, HDP-CVD oxide, etc.

The contact tip 126a is formed at the lateral portion of the electrode 130a. The contact tip 126a may protrude toward the first and the second word lines 106a and 136a. The contact tip 126a may be separated from the first and the second word lines 106a and 136a. In an example embodiment, two contact tips 126a may be formed at both of the lateral portions of the electrode 130a. The contact tip 126a may include a conductive material having elasticity. The contact tip 126a may be bent along a predetermined direction by a voltage applied to the contact tip 126a. The contact tip 126a may include a material substantially the same as the electrode 130a. Examples of the conductive material used in the contact tip 126a may include a metal such as titanium, a metal nitride such as titanium nitride, or other conductive material such as carbon. Here, the first word line 106a is spaced apart from the corresponding second word line 136a by a distance to provide a space within which the contact tip 126a is movable.

The contact tip 126a may make contact with the first word line 106a or the second word line 136a when at least one of the lateral portions of the electrode 130a is bent toward the first word line 106a or the second word line 136a by the electric field generated between the first word line 106a and the second word line 136a. The contact tip 126a may be protruded toward the first or the second word lines 106a and 136a so that a gap between the contact tip 126a and the first word line 106a may be substantially narrower than a gap between the electrode 130a and the first word line 106a. Further, a gap between the contact tip 126a and the second word line 136a may be substantially narrower than a gap between the electrode 130a and the second word line 136a.

In an example embodiment, the contact chip 126a may easily move upwardly or downwardly in the space provided by the third insulating interlayer 142 and the second insulating interlayer 116. Here, an inactive gas may fill up the space in which at least one of the lateral portions of the electrode 130a is bent upwardly or downwardly. The inactive gas may include a nitrogen gas a helium gas, etc.

In an example embodiment, an additional insulating interlayer or an insulation structure (not illustrated) may be formed between adjacent second word lines 136a while ensuring movement of the contact tip 126a and the lateral portion of the electrode 130a.

In the memory device having the above-described construction, when predetermined charges flow into the contact tip 126a through the bit line 102 and the electrode 130a, a voltage difference between the first and the second word lines 106a and 136a may cause an electric field between the first and the second word lines 106a and 136a. Therefore, the contact tip 126a may be bent toward the first word line 106a or the second word line 136a by the electric field. That is, the contact tip 126a may move toward the first word line 106a or the second word line 136a by a Coulomb force.

When the contact tip 126a has a polarity opposed to the first word line 106a or the second word line 136a, an attractive force may work so that the contact tip 126a may move toward the first word line 106a or the second word line 136a. Since the charges applied through the electrode 126a may be concentrated at the contact tip 126a, the contact tip 126a may make contact with the first word line 106a or the second word line 136a.

When the contact tip 126a has a polarity the same as the first word line 106a or the second word line 136a, a repulsive force may work such that the contact tip 126a may be separated or move away from the first word line 106a or the second word line 136a. When the contact tip 126a makes contact with the first word line 106a, the memory device may have data "0". Whereas the contact tip 126a and the first word line 106a are separated from each other, the memory device may have data "1." Thus, data of one bit may be programmed into the memory device or erased from the memory device.

The Coulomb force between the contact tip 126a and the first word line 106a may increase in accordance with a reduction of a distance between the contact tip 126a and the first word line 106a. The electrode 130a may be easily bent toward the first word line 106a as an increase of the Coulomb force. Similarly, a voltage applied between the contact tip 126a and the first word line 106a may decrease as the distance between the contact tip 126a and the first word line 106a decreases.

In an example embodiment, the memory device includes two contact tips 126a formed at both of the lateral portions of the electrode 130a. Each of the contact tips 126a may be protruded from ends of the electrode 130a toward the first and the second word lines 106a and 136a. Thus, distances between the contact tips 126a and the first word line 106a are decreased to thereby reduce a voltage to contact the contact tips 126a to the first word line 106a. Electric charges may be effectively concentrated in the contact tips 126a since the contact tips 126a have substantially sharp shapes. As a result, the memory device may operate at a lower voltage. That is, programming and erasing operations of the memory device may be performed at a relatively low voltage.

Meanwhile, distances among the electrode 130a, the first word line 106a and the second word line 136a may be sufficiently maintained so that an attractive force among the electrode 130a, the first word line 106a and the second word line 136a caused by a van der Waals force may be effectively decreased. Thus, the memory device may stably operate by considerably reducing the attractive force among the electrode 130a, the first word line 106a and the second word line 136a.

Hereinafter, reading and writing operations of the memory device in accordance with example embodiments of the present general inventive concept will be described with reference to accompanying drawings.

Figure 3:
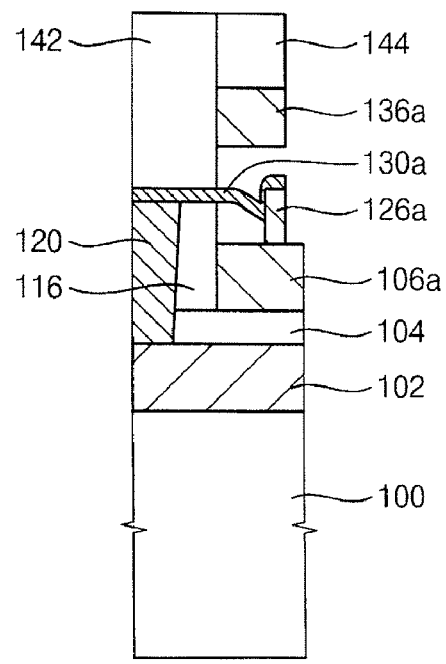
FIG. 3 is a cross-sectional view illustrating a memory device in accordance with an example embodiment of the present general inventive concept when data "0" is recorded in a cell of the memory device.
Figure 4:
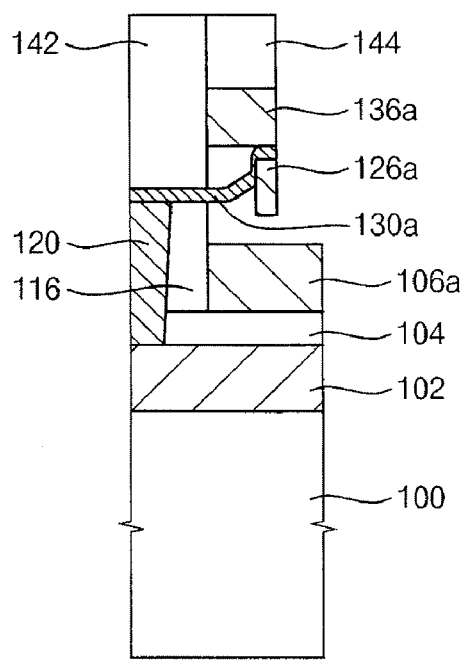
FIG. 4 is a cross-sectional view illustrating a memory device in accordance with an example embodiment of the present general inventive concept when data "1" is recorded in a cell of the memory device.

FIG. 3 is a cross-sectional view illustrating the memory device when data "0" is recorded in a cell of the memory device. FIG. 4 is a cross-sectional view illustrating the memory device when data "1" is recorded in the cell of the memory device.

In the writing operation of the memory device, the lateral portion having the contact tip 126a may be bent toward the first word line 106a by an attractive force generated between the contact tip 126a and the first word line 106a when charges having opposite polarities are applied to the contact tip 126a and the first word line 106a, respectively. In the mean time, the lateral portion having the contact tip 126a may be also bent toward the first word line 106a by a repulsive force generated between the contact tip 126a and the second word line 136a according as charges having same polarities are applied to the contact tip 126a and the second word line 136a, respectively.

A Coulomb force between the contact tip 126a and the first word line 106a may increase in accordance with a reduction of a distance between the contact tip 126a and the first word line 106a. Therefore, the contact tip 126a may make contact with the first word line 106a as illustrated in FIG. 3.

When the contact tip 126a makes contact with the first word line 106a, a contact state between the contact tip 126a and the first word line 106a may be continuously maintained by applying predetermined charges having the opposite polarities into the contact tip 126a and the first word line 106a. That is, the contact state between the contact tip 126a and the first word line 106a may be maintained because an electrostatic force represented as the Coulomb force is substantially stronger than an elastic force of the electrode 130a or a restoring force of the electrode 130a.

The lateral portion of the electrode 130a may be changed with an original shape disposed substantially parallel to the first direction and a first bent shape as illustrated in FIG. 3, and a second bent shape as illustrated in FIG. 4. The predetermined changes cause the lateral portion to be in the first or second bent shape.

Meanwhile, a repulsive force may be generated between the contact tip 126a and the first word line 106a when charges having same polarities are applied to the contact tip 126a and the first word line 106a. Accordingly, the contact tip 126a may be separated from the first word line 106a by the repulsive force. In an example embodiment, charges having opposite polarities may be applied to the contact tip 126a and the second word line 136a so as to move the contact tip 126a toward the second word line 136a as illustrated in FIG. 4.

As described above, data of one bit may be recorded in the cell of the memory device according to the contact state between the contact tip 126a and the first word line 106a. In an example embodiment, data "0" may be defined as the contact state between the contact tip 126a and the first word line 106a whereas data "1" may be defined as a separation state between the contact tip 126a and the first word line 106a. Alternatively, data "0" may be defined as the separation state between the contact tip 126a and the first word line 106a whereas data "1" may be defined as the contact state between the contact tip 126a and the first word line 106a.

In the reading operation of the memory device, first charges may flow into the contact tip 126a through the bit line 102 whereas second charges having polarities opposed to the first charges may flow into the second word line 136a. When data "0", indicating the contact state between the contact tip 126a and the first word line 106a as illustrated in FIG. 3, is recorded in the memory device, the contact tip 126a may be separated from the second word line 136a. Thus, a current may not flow between the contact tip 126a and the second word line 136a. When data "1", denoting the contact state between the contact tip 126a and the first word line 106a, is recorded in the memory device, the contact tip 126a may make contact with the second word line 136a as illustrated in FIG. 4. Accordingly, a current may flow between the contact tip 126a and the second word line 136a, thereby reading the data recorded in the cell of the memory device.

Figure 5:
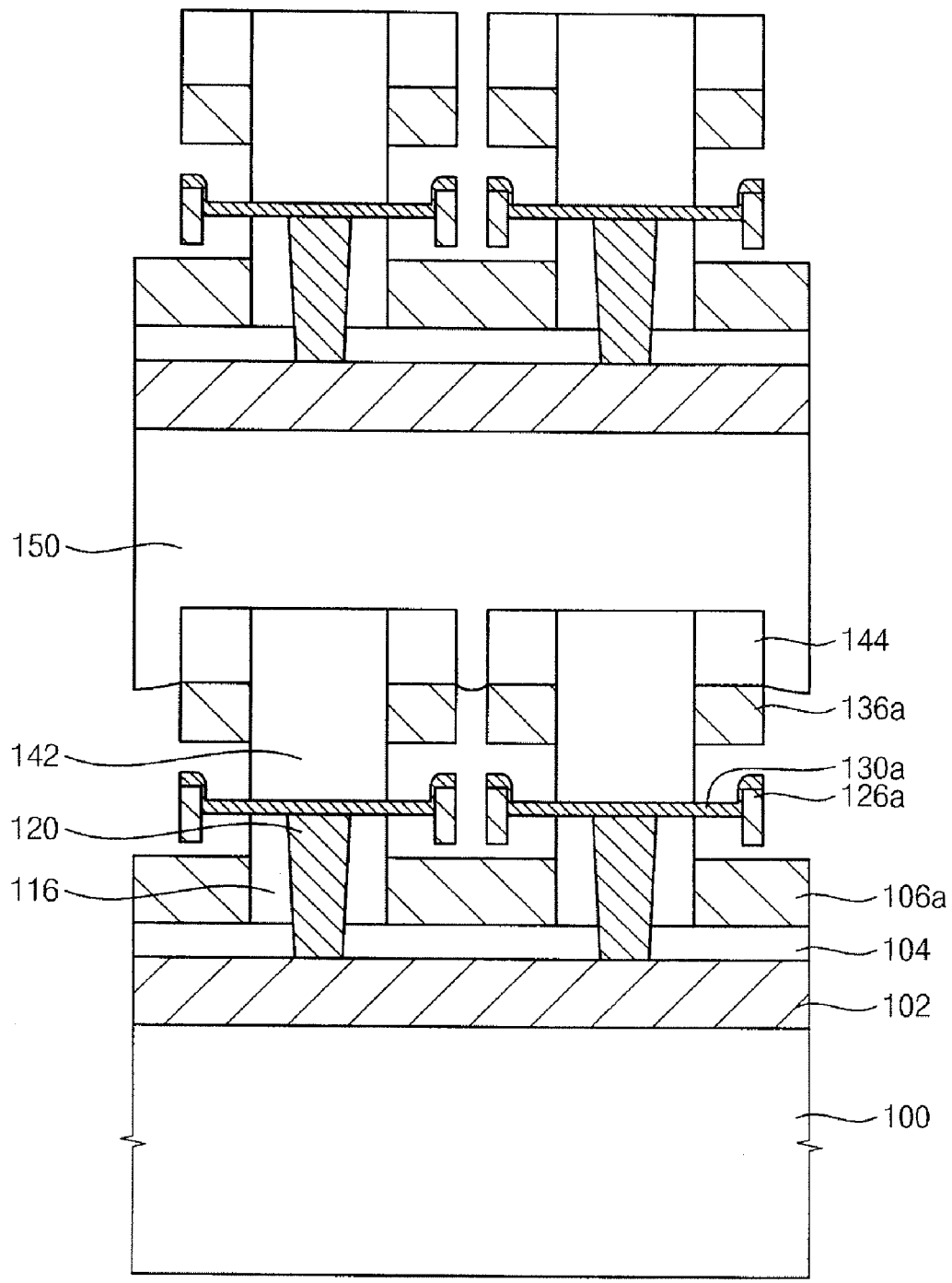
FIG. 5 is a cross-sectional view illustrating a memory device in accordance with an example embodiment of the present general inventive concept.

FIG. 5 is a cross-sectional view illustrating a memory device in accordance with an example embodiment of the present general inventive concept. In FIG. 5, the memory device may include two memory units having constructions substantially the same as the memory device described with reference to FIG. 2.

Referring to FIG. 5, the memory device includes an additional insulating interlayer 150 formed between a lower memory unit and an upper memory unit. The additional insulating interlayer 150 is positioned on a third insulating interlayer 142 and a second word line 136a and/or a hard mask 144. A portion of the additional insulating interlayer 150 formed between adjacent second word lines 136a may be positioned substantially higher than the second word lines 136a so as to provide a space in which an electrode 130a is bent toward a first word line 106a and/or the second word line 136a. The additional insulating interlayer 150 may also have a level upper face substantially in parallel to a substrate 100.

The lower memory unit provided on the substrate 100 includes a bit line 102, a first insulating interlayer 104, the first word line 106a, a second insulating interlayer 116, a bit line contact 120, the electrode 130a, a contact tip 126a, the second word line 136a, the third insulating interlayer 142, and a hard mask 144.

The upper memory unit is provided on the additional insulating interlayer 150. The upper memory unit may have a construction substantially the same as the lower memory unit. For example, the upper memory unit may include a bit line, a first word line, a second word line, an electrode, a contact tip, a first insulating interlayer, a second insulating interlayer, a bit line contact, a third insulating interlayer and a hard mask.

In the memory device having the above-described construction, the upper memory unit may not be formed on a substrate so that a plurality of memory units may be easily stacked in serial. Thus, the memory device may have a high integration degree.

In an example embodiment, a plurality of memory units stacked in serial may include bit lines crossing with one another. That is, an upper bit line may extend along a direction substantially perpendicular to a direction of a lower bit line. Further, at least one switching device including a transistor may be employed in the memory device so as to control a voltage applied to the memory device.

Hereinafter, a method of manufacturing a memory device according to example embodiments of the present general inventive concept will be described in detail with reference to the accompanying drawings.

FIGS. 6A to 19B are cross-sectional views and perspective views illustrating the method of manufacturing the memory device. FIGS. 6A, 7A, 8A, 9A, 10A, 11A, 12A, 13A, 14A, 15A, 16A, 17A, 18A and 19A are the cross-sectional views illustrating the method of manufacturing the memory device. FIGS. 6B, 7B, 8B, 9B, 10B, 11B, 12B, 13B, 14B, 15B, 16B, 17B, 18B and 19B are the perspective views illustrating the method of manufacturing the memory device. In FIGS. 6B, 7B, 8B, 9B, 10B, 11B, 12B, 13B, 14B, 15B, 16B, 17B, 18B and 19B, "I" represents a first direction and "II" indicates a second direction. For example, the first direction (I) may be substantially parallel to a bit line 102 whereas the second direction (II) may be substantially perpendicular to the first direction (I). Although the method of manufacturing the memory device having a construction substantially the same as that described with reference to FIGS. 1 and 2 will be described with reference to FIGS. 6A to 19B, the method according to example embodiments may be advantageously employed in manufacturing other memory devices.

Figure 6A:
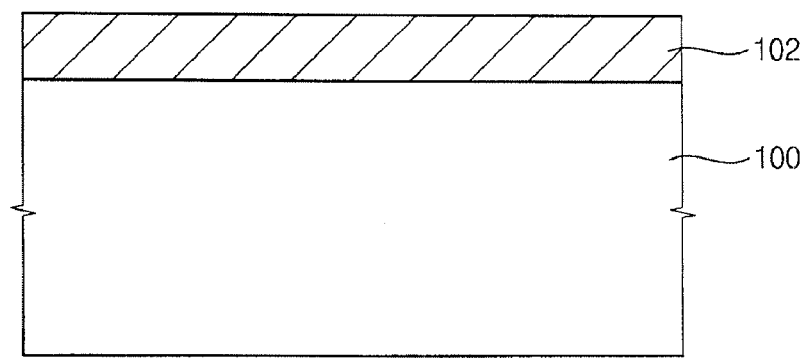
FIGS. 6A, 7A, 8A, 9A, 10A, 11A, 12A, 13A, 14A, 15A, 16A, 17A, 18A and 19A are cross-sectional views illustrating a method of manufacturing a memory device in accordance with an example embodiment of the present general inventive concept.
Figure 6B:
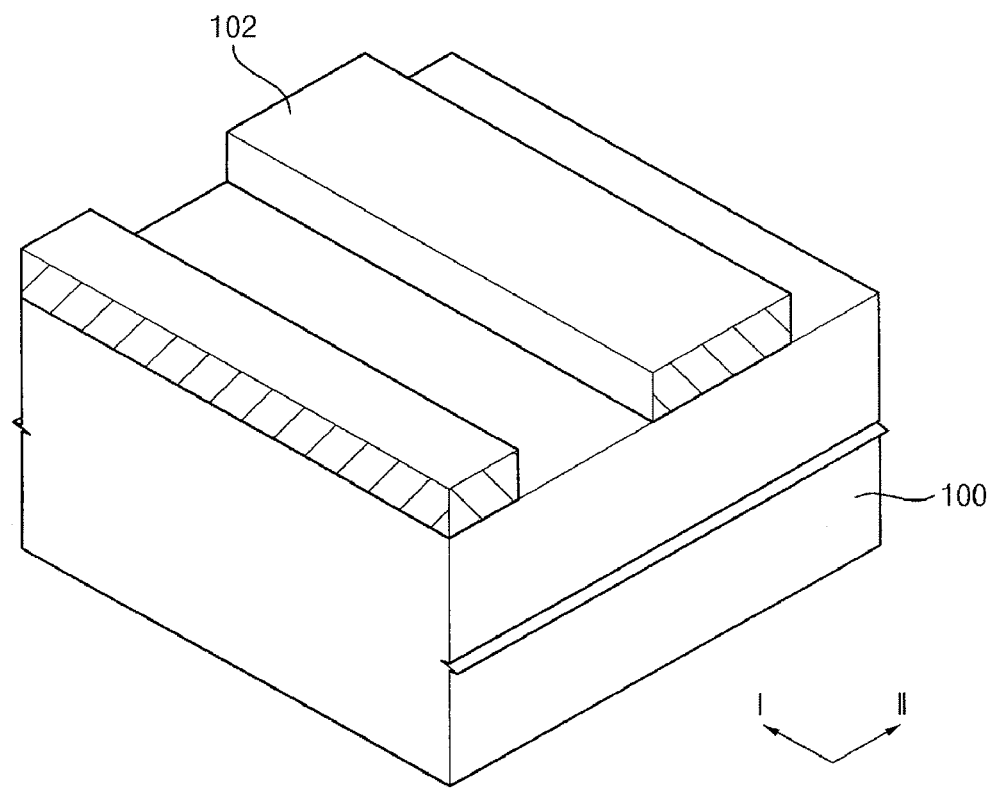
FIGS. 6B, 7B, 8B, 9B, 10B, 11B, 12B, 13B, 14B, 15B, 16B, 17B, 18B and 19B are perspective views illustrating a method of manufacturing a memory device in accordance with an example embodiment of the present general inventive concept.

Referring to FIGS. 6A and 6B, a substrate 100 having an insulation upper portion is prepared, and then a first conductive layer (not illustrated) is formed on the substrate 100. The first conductive layer may be formed using a metal, a metal compound, doped polysilicon, etc. For example, the first conductive layer may be formed using gold, silver, copper, aluminum, tungsten, titanium, tantalum, tungsten silicide, titanium nitride, tantalum silicide, etc., used alone or in a mixture thereof. The first conductive layer may be formed by a physical vapor deposition (PVD) process or a chemical vapor deposition (CVD) process.

An etching mask (not illustrated) is formed on the first conductive layer. The first conductive layer is etched using the etching mask to form the bit line 102 on the substrate 100. The bit line 102 may be formed by an anisotropic etching process. The bit line 102 may extend along a first direction (I) in FIG. 6B. For example, the bit line 102 may have a line shape in the first direction (I). The etching mask may be removed from the bit line 102.

Figure 7A:
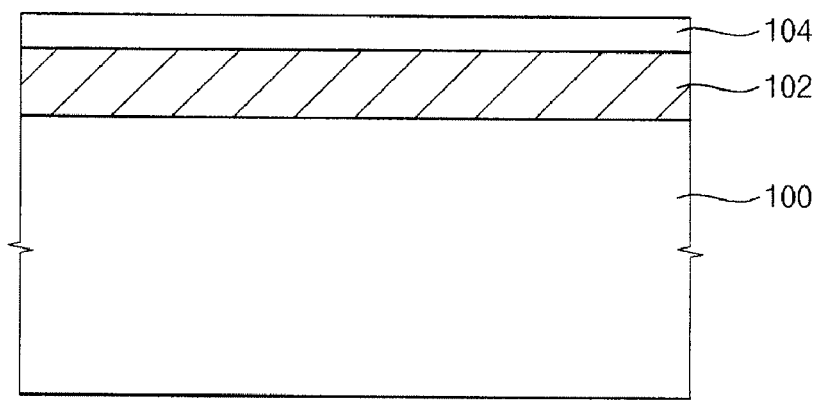
Figure 7B:
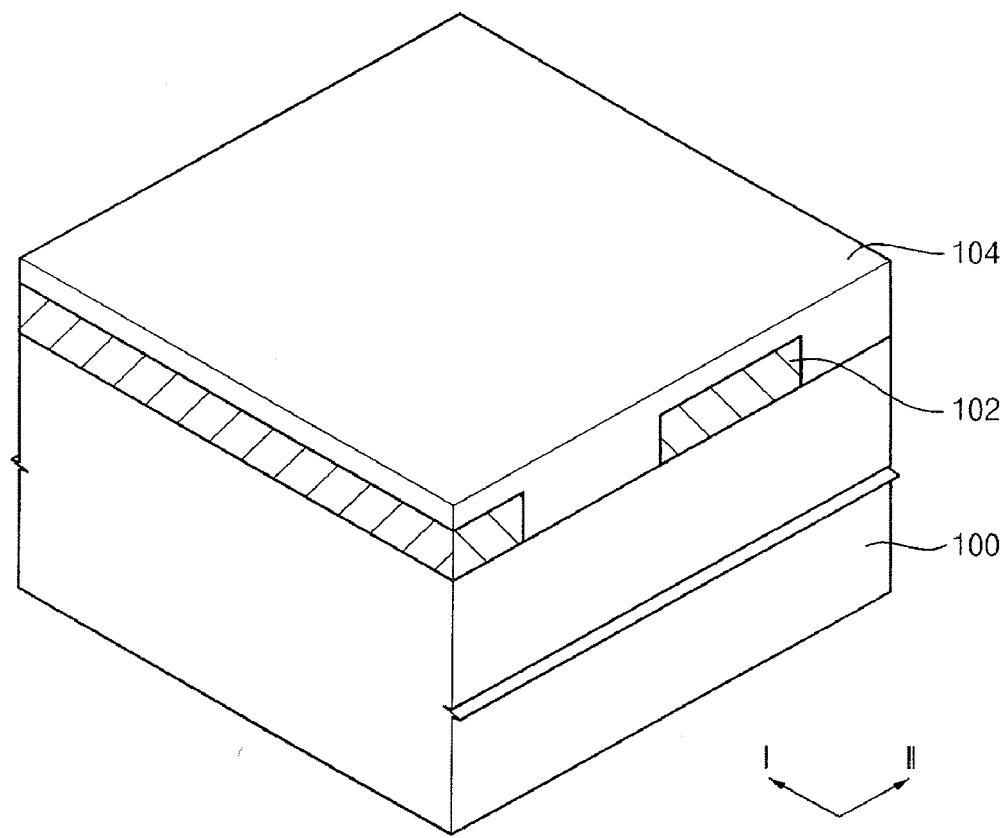

Referring to FIG. 7A and FIG. 7B, a first insulation layer (not illustrated) is formed on the substrate 100 to cover the bit line 102. The first insulation interlayer may fill a gap between adjacent bit lines 102. The first insulation layer may be formed using an oxide such as silicon oxide. For example, the first insulation layer may be formed using BPSG, PSG, SOG, FOX, TEOS, USG, HDP-CVD oxide, etc. Additionally, the first insulation layer may be formed by a CVD process.

In an example embodiment, the first insulation layer may have a level upper face by a planarization process such as a CMP process and/or an etch-back process. The first insulation layer may be partially removed to form a first insulating interlayer 104 on the substrate 100 before the bit line 102 is exposed.

Figure 8A:
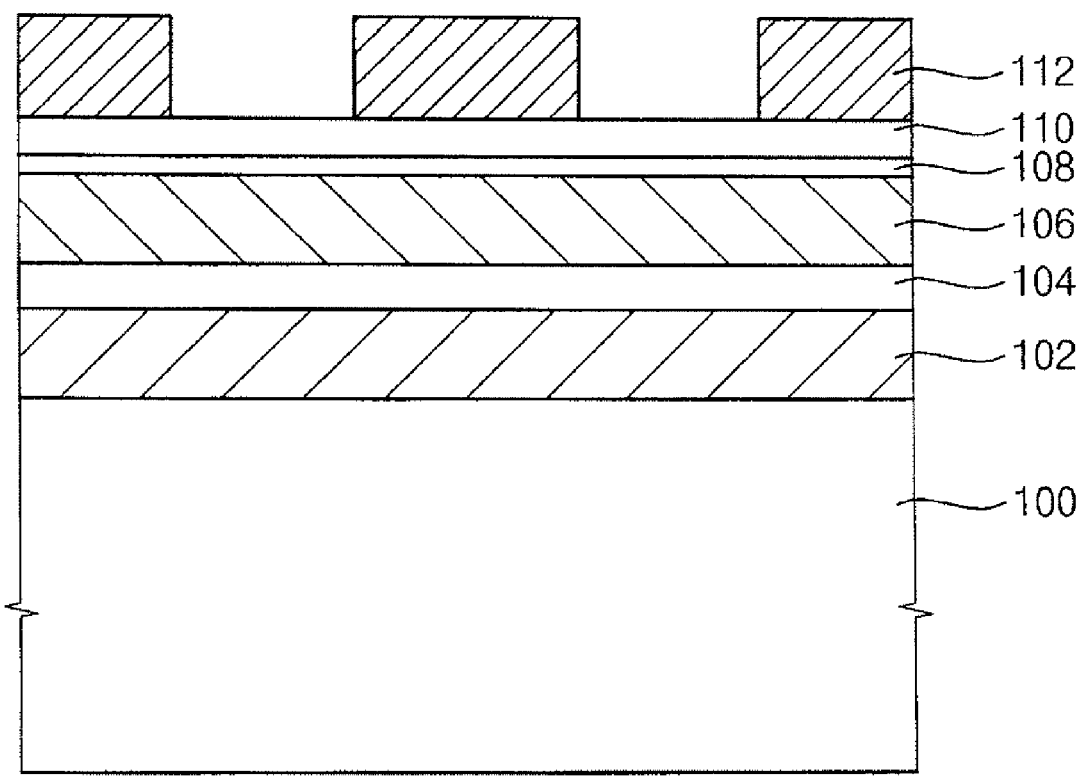
Figure 8B:
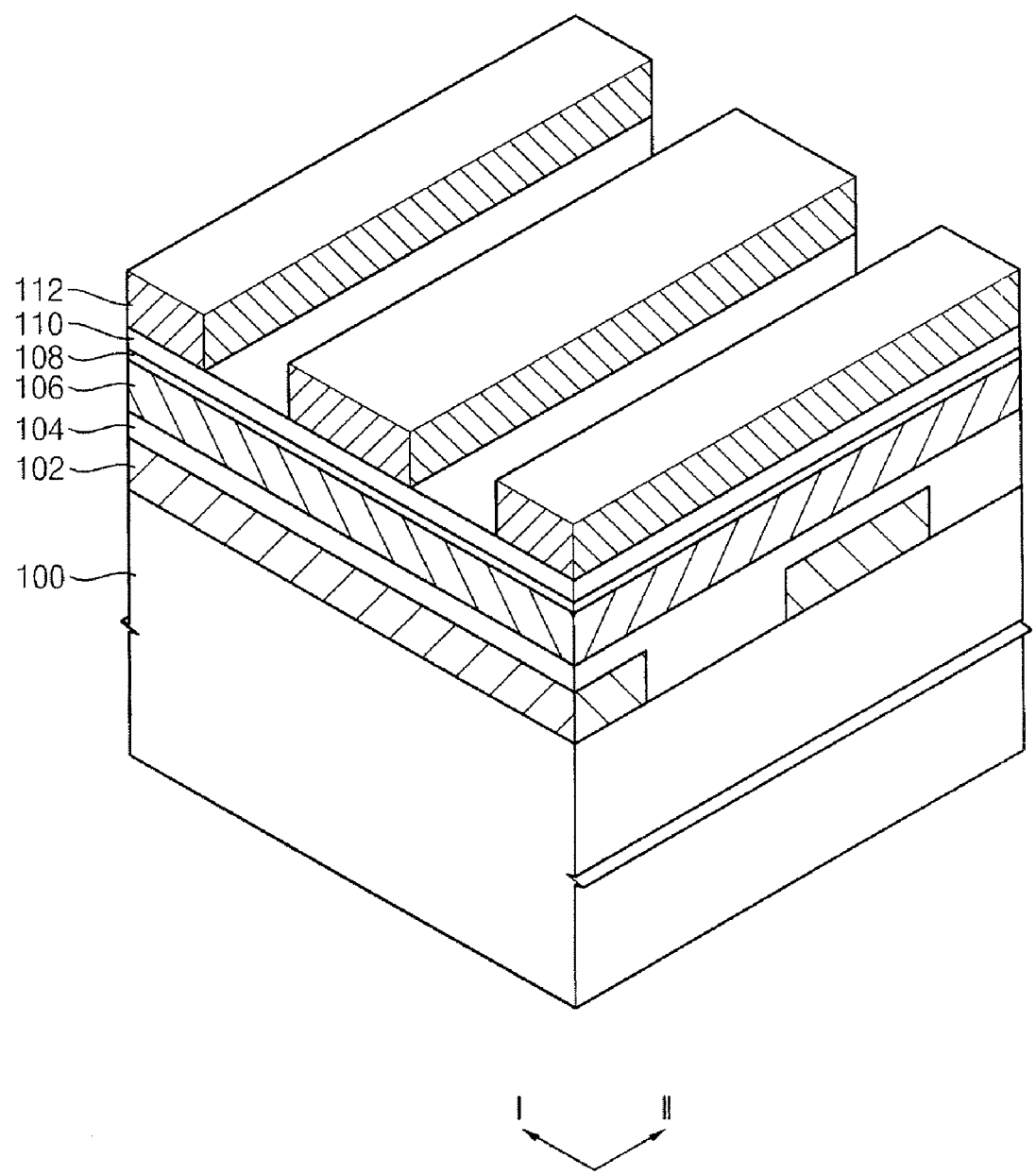

Referring to FIGS. 8A and 8B, a second conductive layer 106 is formed on the first insulating interlayer 104. The second conductive layer 106 may be patterned to form a first word line 106a (see FIGS. 9A and 9B) by a subsequent process. The second conductive layer 106 may be formed using a metal, polysilicon doped with impurities, a metal compound, etc. The second conductive layer 106 may be formed by a PVD process, a CVD process, an ALD process, etc. In an example embodiment, the second conductive layer 106 may be formed using a metal having an electrical resistance substantially lower than doped polysilicon. For example, the second conductive layer 106 may be formed using gold, silver, copper, aluminum, tungsten, tungsten silicide, titanium, titanium silicide, tantalum, tantalum silicide, etc., used alone or a mixture thereof.

A first sacrificial layer 108 is formed on the second conductive layer 106. The first sacrificial layer 108 is removed by subsequent processes to provide a space where the first sacrificial layer 108 is positioned. A contact tip 126a (see FIGS. 18A and 18B) may be bent in the space. In an example embodiment, the first sacrificial layer 108 may be formed using a material that is easily removed by an etching process. That is, the first sacrificial layer 108 may have an etch selectivity with respect to the second conductive layer 106. For example, the first sacrificial layer 108 may be formed using polysilicon. Alternatively, the first sacrificial layer 108 may be formed using an organic insulation material.

In an example embodiment, a thickness of the first sacrificial layer 108 may be substantially the same as a height or a width of the space. When the first sacrificial layer 108 has a thickness below about 50 Å, the height or the width of the space may be relatively small. Accordingly, an attractive force between the contact tip 126a and the first word line 106a may relatively increase so that the contact tip 126a may easily move toward the first word line 106a even though a small voltage is applied. Here, the attractive force may correspond to a van der Waals force. When the first sacrificial layer 108 has a thickness above about 150 Å, the height or the width of the space may be relatively large such that a voltage to move the contact tip 126a toward the first word line 106a may be increased. In an example embodiment, the first sacrificial layer 108 may have a thickness in a range of about 50 Å to about 150 Å.

A second sacrificial layer 110 is formed on the first sacrificial layer 108. The second sacrificial layer 110 may serve as a mold to form the contact tip 126a. A thickness of the contact tip 126a may vary in accordance with a thickness of the second sacrificial layer 110. That is, the thickness of the contact tip 126a may be adjusted by controlling the thickness of the second sacrificial layer 110. In an example embodiment, the second sacrificial layer 110 may be formed using a material which is easily removed by a wet etching process for a precise formation of the contact tip 126a without generation of residues caused by the second sacrificial layer 110. Additionally, the second sacrificial layer 110 may have an etching selectivity with respect to the first sacrificial layer 108. For example, the second sacrificial layer 110 may be formed using silicon germanium when the first sacrificial layer 108 includes polysilicon.

A first hard mask layer (not illustrated) is formed on the second sacrificial layer 110. The first hard mask layer may be formed using a nitride such as silicon nitride. The first hard mask layer may be formed by a CVD process. Then, the first hard mask layer is partially etched to form a first mask 112 on the second sacrificial layer 110. In an example embodiment, the first mask 112 may have a line shape extending along the second direction (II).

Figure 9A:
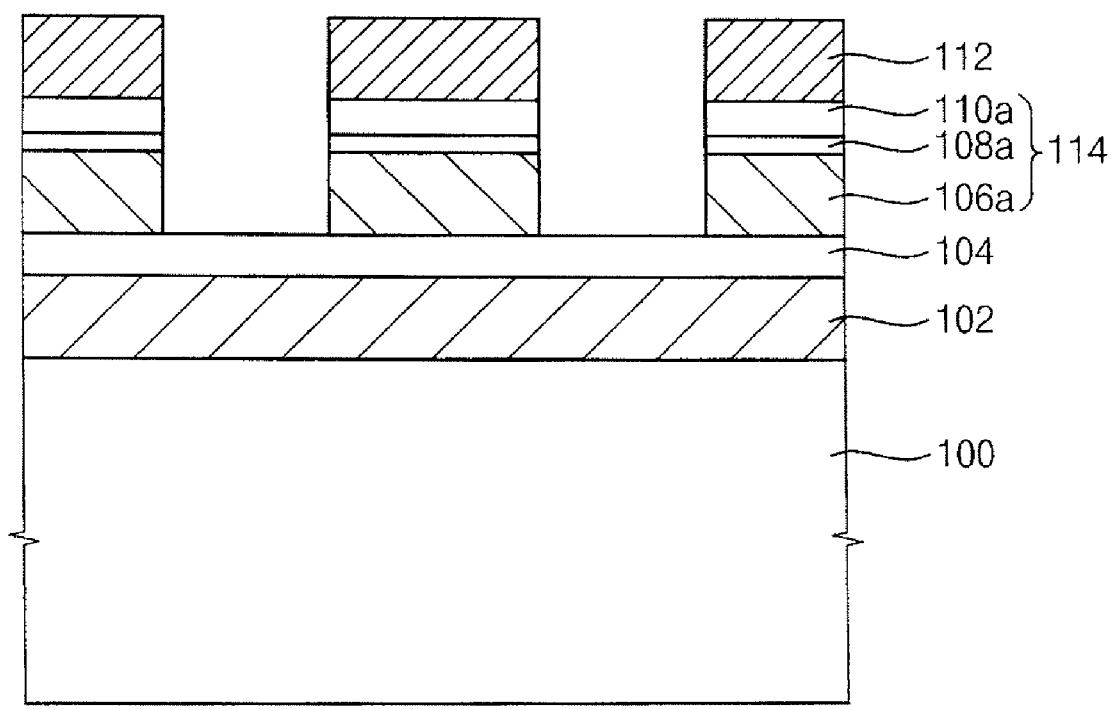
Figure 9B:
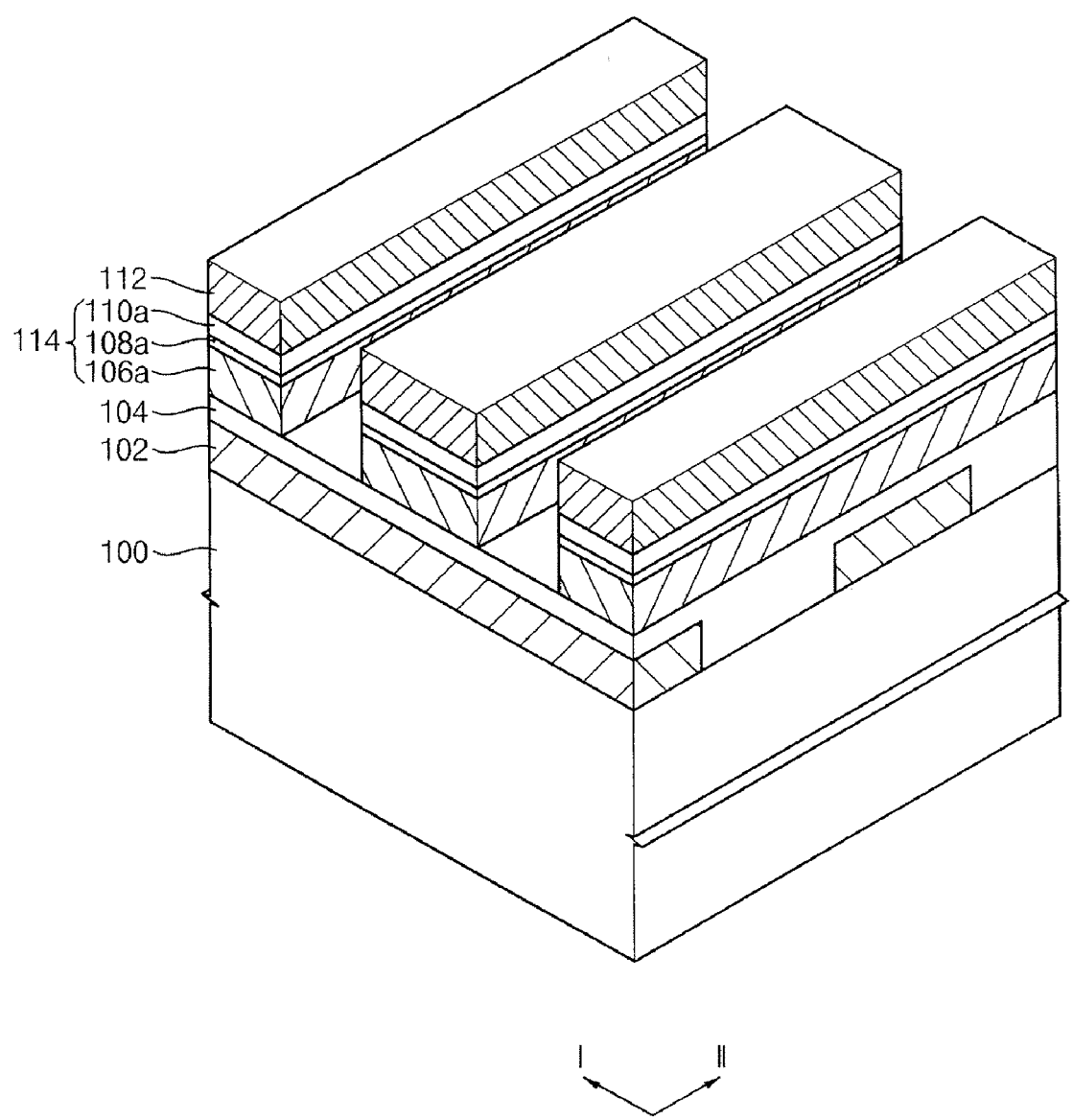

Referring to FIGS. 9A and 9B, the second sacrificial layer 110, the first sacrificial layer 108 and the second conductive layer 106 are etched using the first hard mask 112 as an etching mask. Thus, a first word line structure 114 is formed on the first insulating interlayer 104. In an example embodiment, the second sacrificial layer 110, the first sacrificial layer 108 and the second conductive layer 106 may be etched by an anisotropic etching process. The first word line structure 114 includes the first word line 106a, a first sacrificial layer pattern 108a and a second sacrificial layer pattern 110a. The first word line 106a, the first sacrificial layer pattern 108a and the second sacrificial layer pattern 110a are sequentially formed on the first insulating interlayer 104. The first word line structure 114 may extend along the second direction (II) so that the first word line structure 114 may cross over the bit line 102. The first word line structure 114 may have a line shape. When the first word line structure 114 is formed, a portion of the first insulating interlayer 104 is exposed between adjacent first word line structures 114.

In example embodiment, a spacer (not illustrated) may be formed on a side wall of the first word line structure 114. For example, the spacer may be formed by anisotropically etching a silicon nitride layer after forming the silicon nitride layer having a uniform thickness on the first word line structure 114 and the first insulating interlayer 104.

Figure 10A:
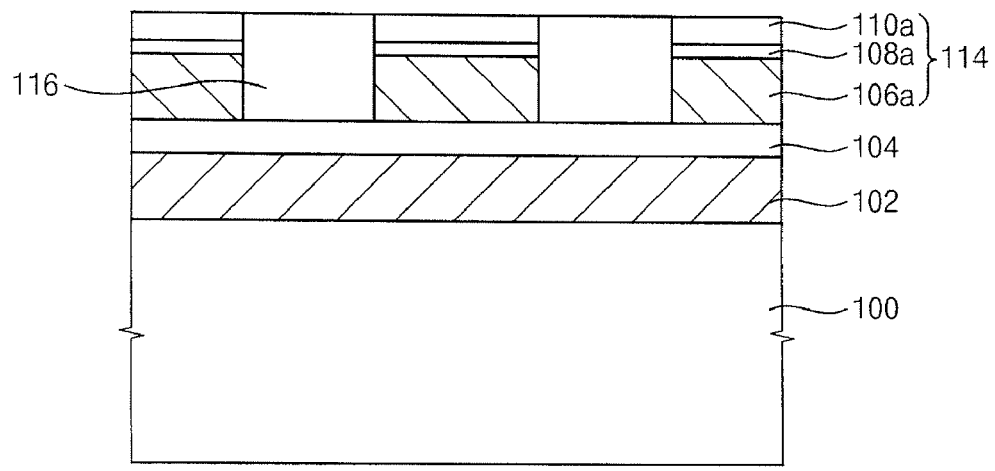
Figure 10B:
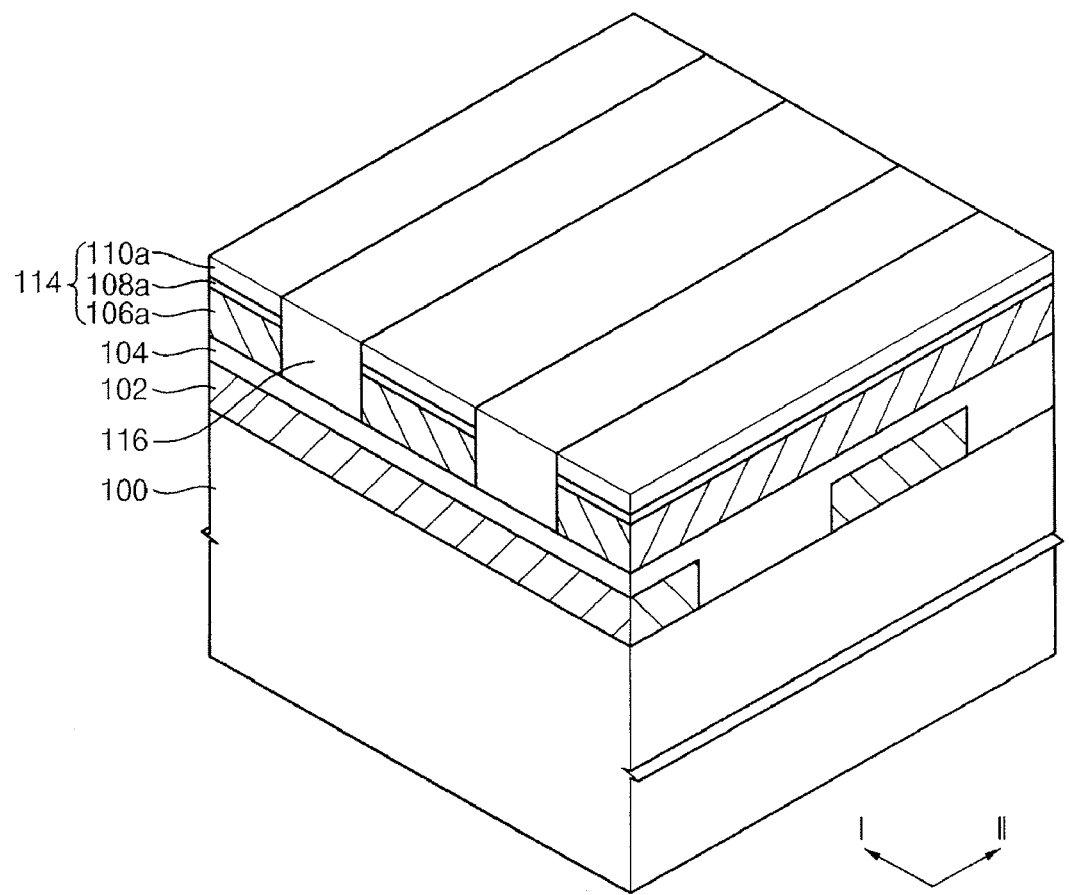

Referring to FIGS. 10A and 10B, a second insulation layer (not illustrated) is formed on the first insulating interlayer 104 and the first word line structure 114 to fill a gap between adjacent first word line structures 114. The second insulation layer may be formed using an oxide such as TEOS, USG, BPSG, PSG, SOG, FOX, HDP-CVD oxide, etc.

An upper portion of the second insulation layer is removed to expose the first mask 112 so that a second insulating interlayer 116 is formed on the first insulating interlayer 104. The second insulating interlayer 116 may have a level upper face. A remaining first hard mask 112 is removed from the first word line structure 114. The remaining first hard mask 112 may be removed using an etching solution containing phosphoric acid.

Figure 11A:
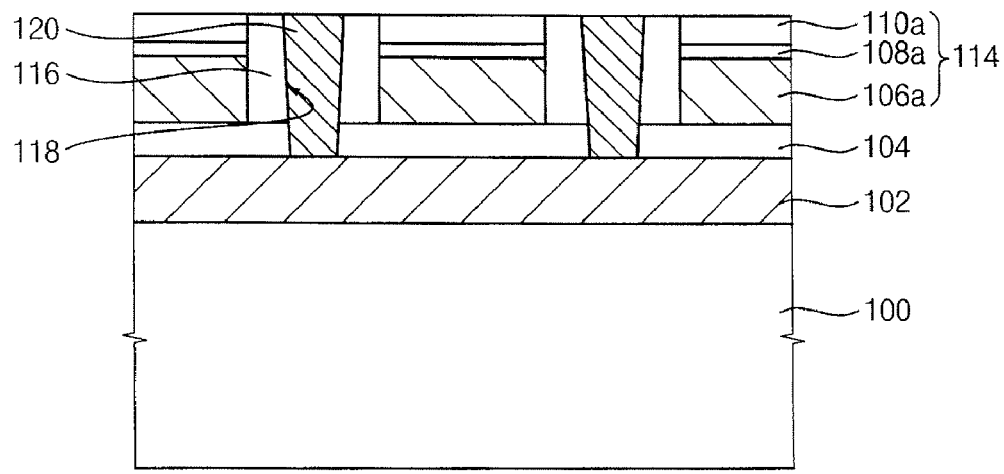
Figure 11B:
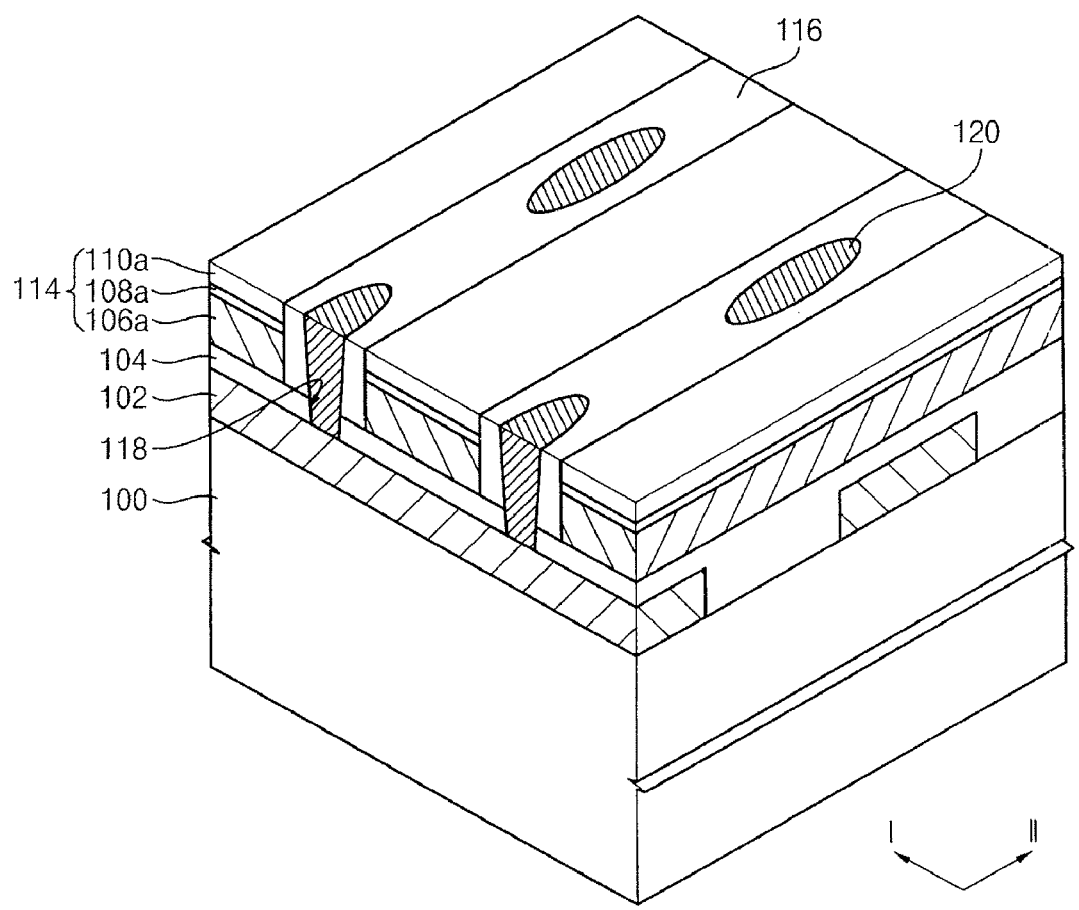

Referring to FIGS. 11A and 11A, an etching mask (not illustrated) is formed on the second insulating interlayer 116 and the first word line structure 114. The etching mask exposes a portion of the first insulating structure 116 positioned over the bit line 102. The etching mask may be formed by patterning a silicon nitride layer after forming the silicon nitride layer on the second insulating interlayer 116 and the first word line structure 114.

The second insulating interlayer 116 and the first insulating interlayer 104 are partially etched using the etching mask until the bit line 102 is exposed so that a bit line contact hole 118 is formed through the first insulating interlayer 104 and the second insulating interlayer 116. The bit line contact hole 118 partially exposes the bit line 102.

When the spacer is formed on the side wall of the first word line structure 114, the bit line contact hole 118 may be formed by a self-aligned etching process which uses an etching selectivity between the spacer and the second insulating interlayer 116. When the self-aligned etching process is employed to form the bit line contact hole 118, the first hard mask 112 may not removed from the first word line structure 114.

A third conductive layer (not illustrated) is formed on the second sacrificial layer pattern 110a to fill the bit line contact hole 118. The third conductive layer may be formed using a metal, a metal compound or doped polysilicon. For example, the third conductive layer may be formed using aluminum, tungsten, titanium, tantalum, gold, silver, copper, tungsten silicide, titanium silicide, tantalum silicide, etc. The third conductive layer may be formed by a PVD process, a CVD process, etc.

The third conductive layer is partially removed until an upper face of the second sacrificial layer pattern 110a is exposed. Thus, a bit line contact 120 is formed on the bit line 102 to fill up the bit line contact hole 118.

Figure 12A:
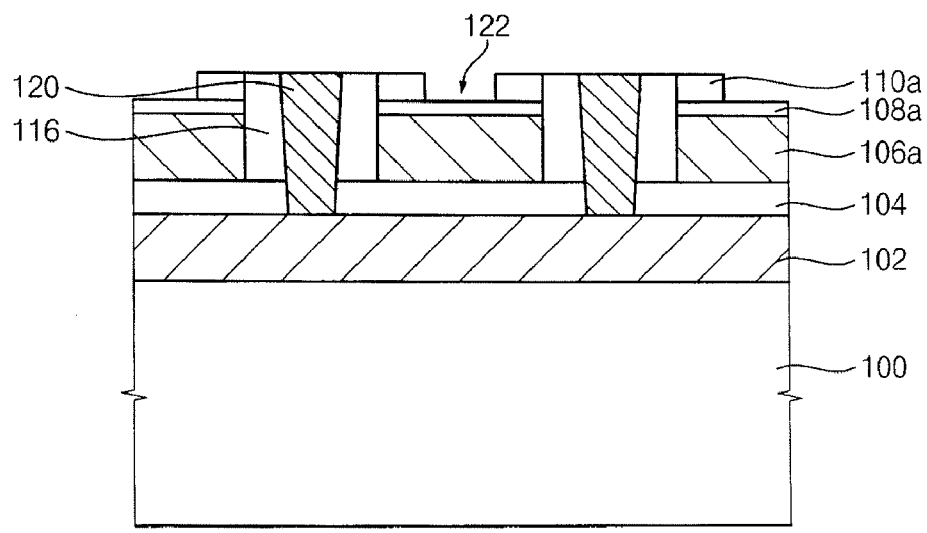
Figure 12B:
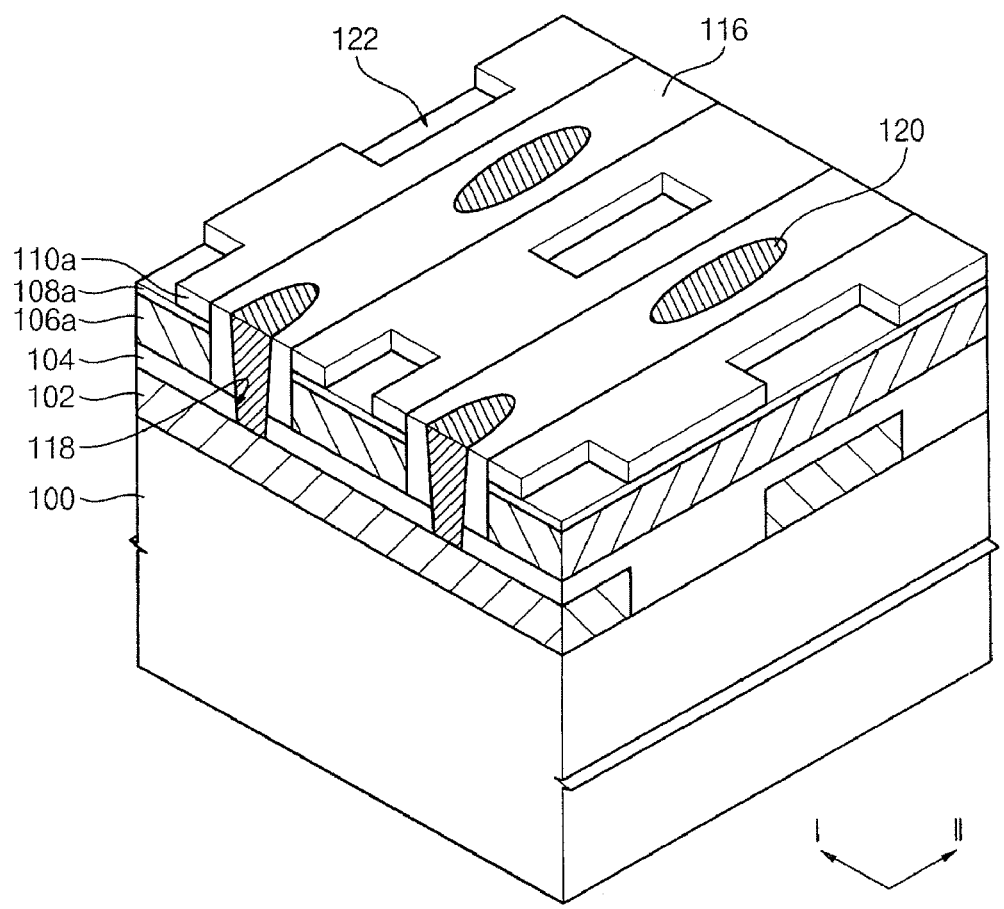

Referring to FIGS. 12A and 12B, after an etching mask (not illustrated) is formed on the second sacrificial layer pattern 110a, the sacrificial layer pattern 110a is etched using the etching mask. A dimple 122 is formed at a portion of the second sacrificial layer pattern 110a disposed over the bit line 102. That is, the dimple 122 may be formed to correspond to an area in which the bit line and the word line overlap. The dimple 122 may be positioned between adjacent bit line contacts 120. In an example embodiment, the first sacrificial layer pattern 108a may serve as an etching stop layer in the etching process to form the dimple 122. After forming the dimple 122, a portion of the first sacrificial layer pattern 108a is exposed through the dimple 122.

In an example embodiment, the dimple 122 may serve as a mold pattern to form two opposing contact tips 126a. Thus, the dimple 122 may be positioned beneath an end portion of an electrode 130a (see FIGS. 18A and 18B).

Figure 13A:
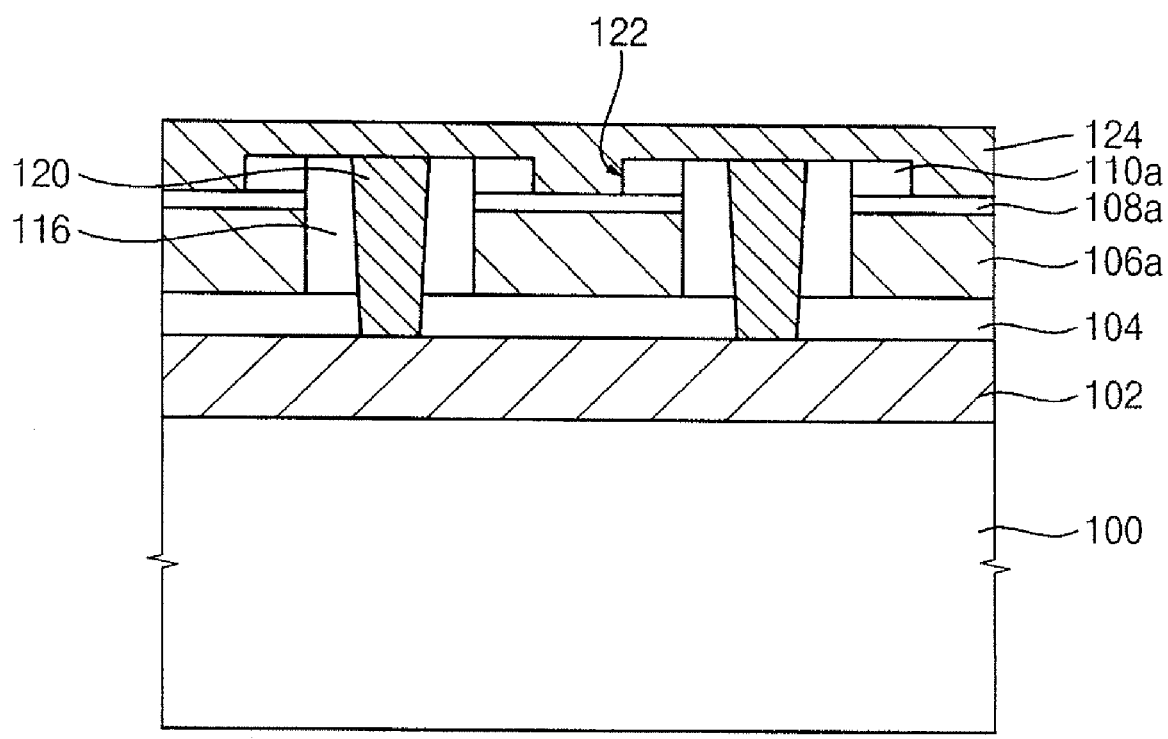
Figure 13B:
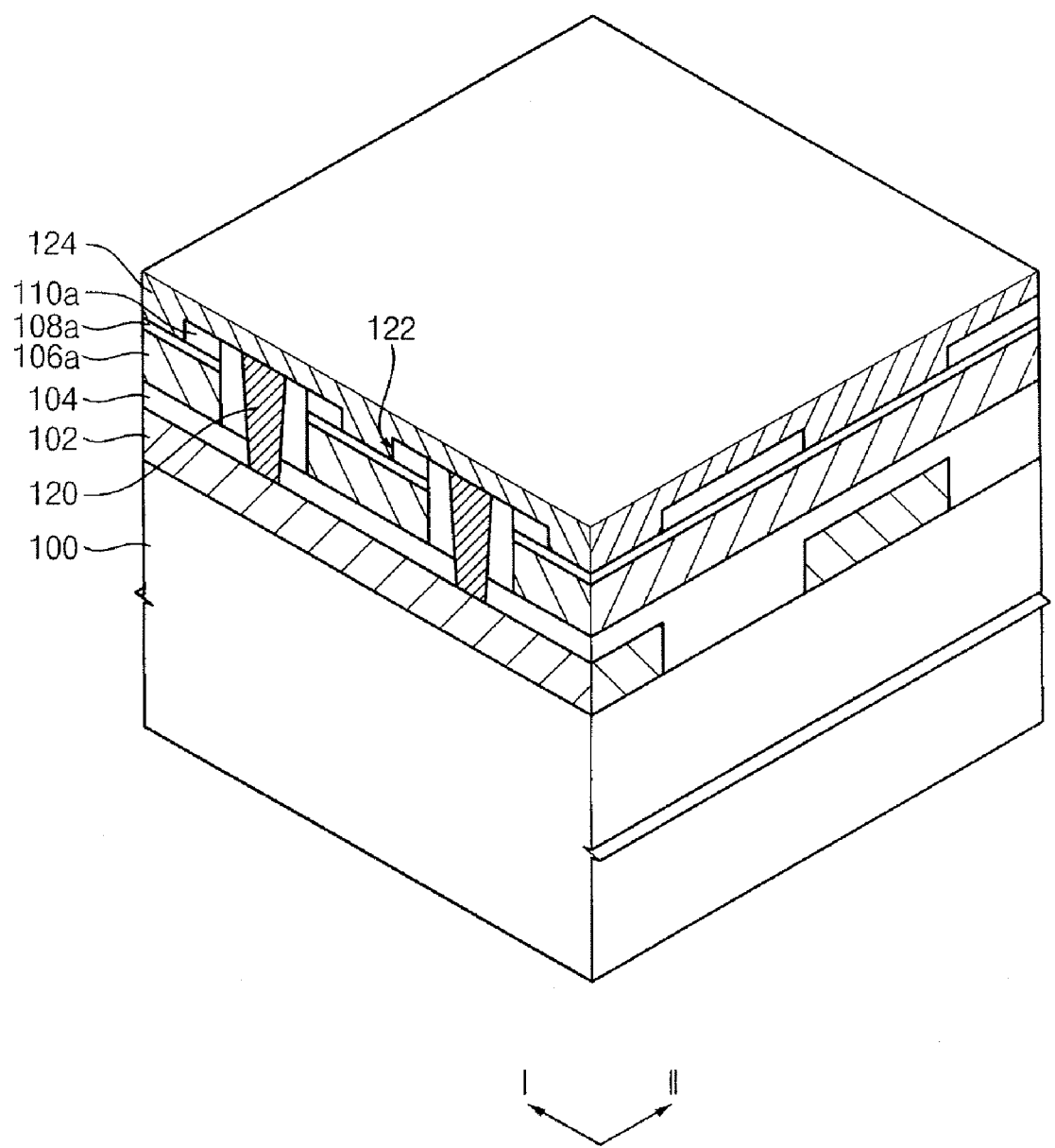
Figure 18A:
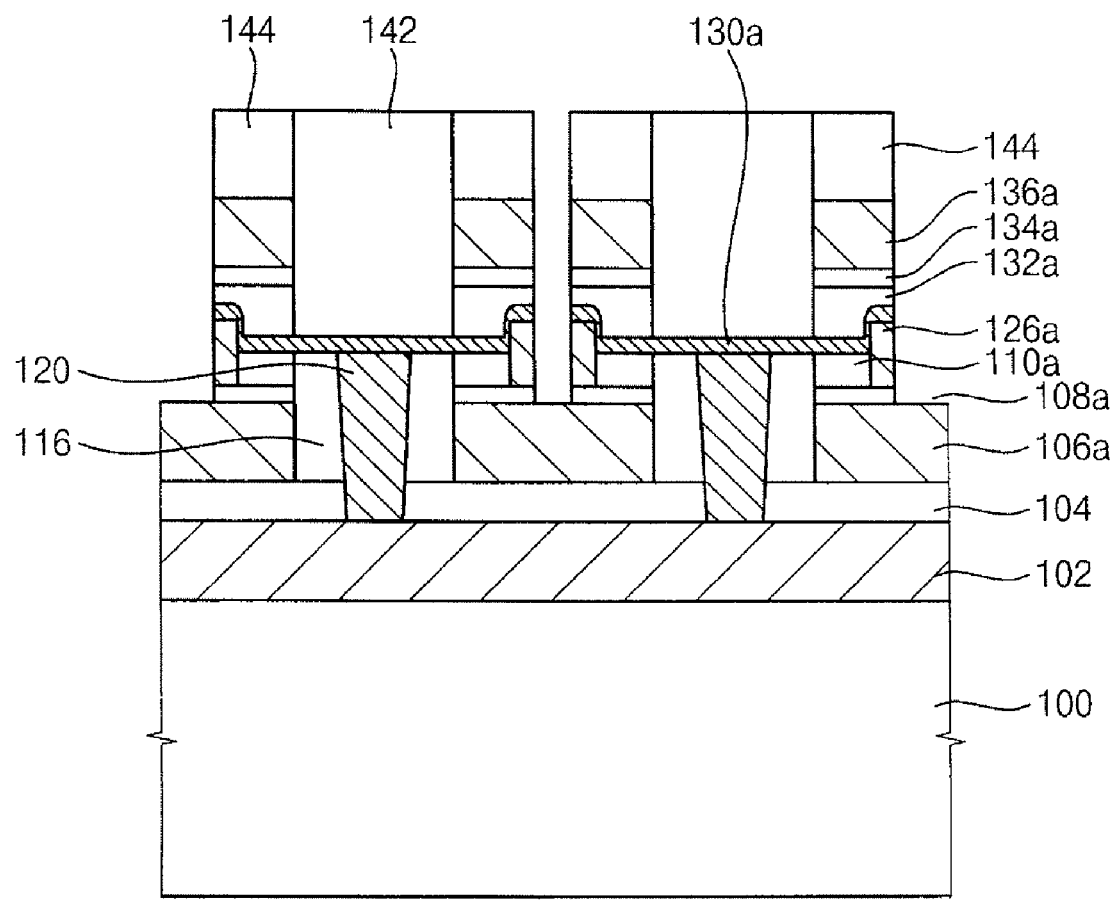

Referring to FIGS. 13A and 13B, a fourth conductive layer 124 is formed on the second sacrificial layer pattern 110a, the first insulating structure 116 and the bit line contact 120. The fourth conductive layer 124 fills up the dimple 122. The fourth conductive layer 124 is patterned to form the contact tip 126a (FIG. 18A). The fourth conductive layer 124 may be formed using a conductive material having an elasticity to be bent by an electric filed around the contact tip 126a. For example, the fourth conductive layer 124 may be formed using a carbon nanotube, a metal such as titanium, or a metal compound such as titanium silicide. The fourth conductive layer 124 may be formed by a PVD process, a CVD process, an electric discharge process, etc. For example, the fourth conductive layer 124 may be formed by the PVD process or the CVD process when the fourth conductive layer 124 includes metal or metal compound. Alternatively, the fourth conductive layer 124 may be formed by the electric discharge process when the fourth conductive layer 124 includes carbon nanotube.

Figure 14A:
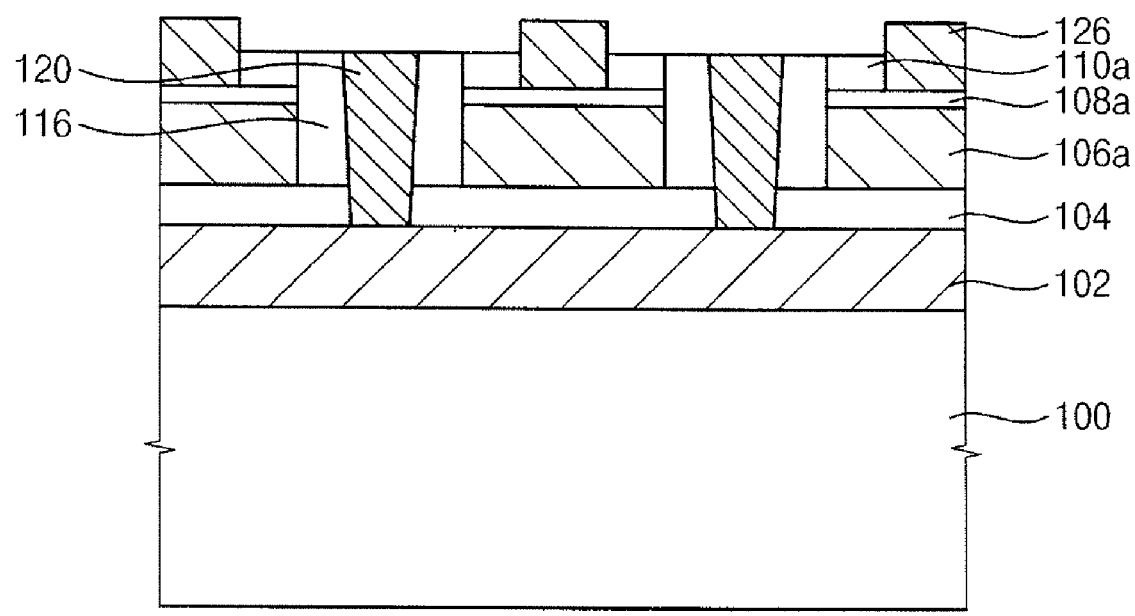
Figure 14B:
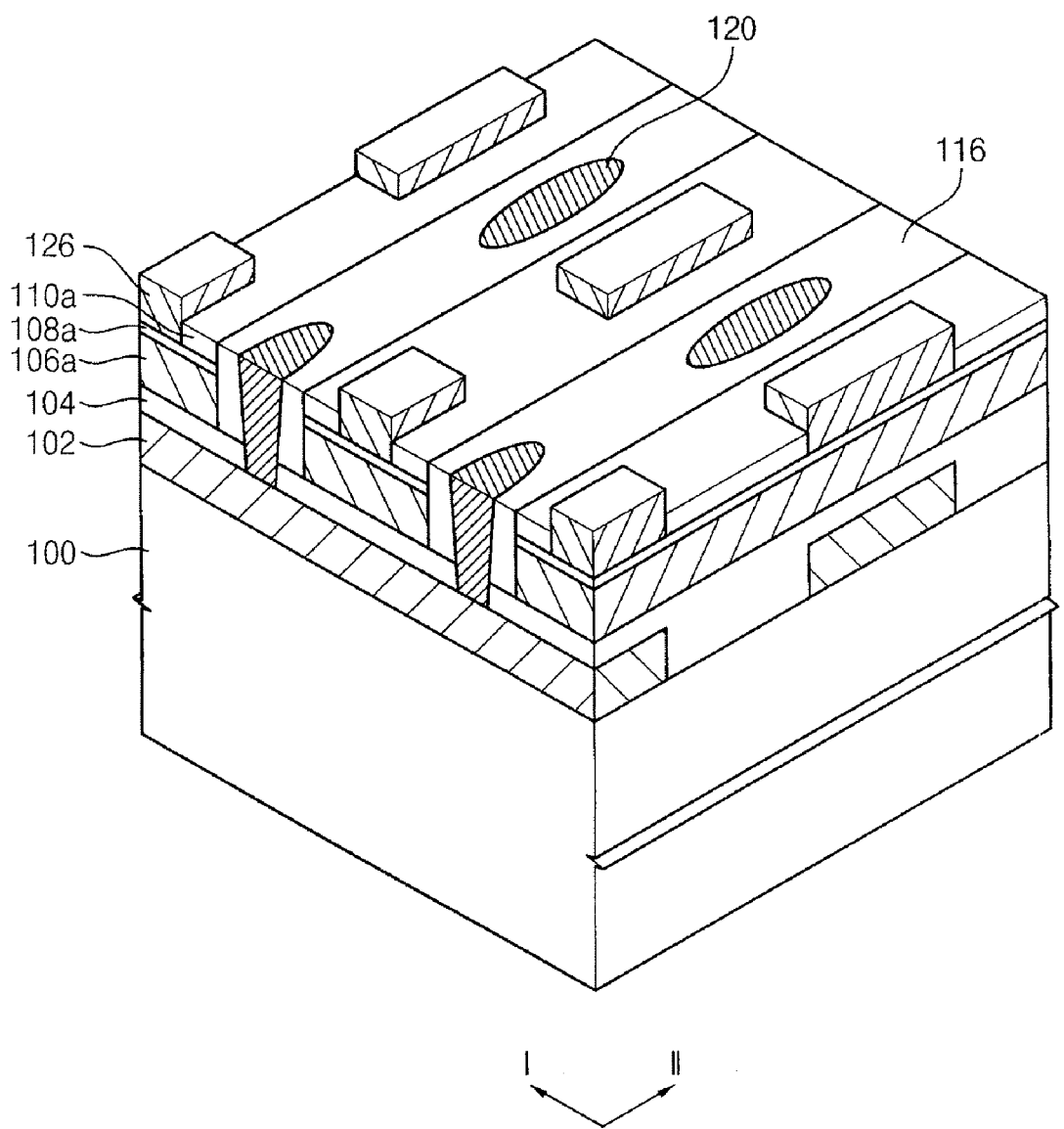

Referring to FIGS. 13A, 14A and 14B, an etching mask (not illustrated) is formed on the fourth conductive layer 124. The etching mask covers a portion of the fourth conductive layer 124 positioned on the dimple 122.

The fourth conductive layer 124 is etched to expose the bit line contact 120 using the etching mask such that a preliminary contact tip 126 is formed on the first sacrificial layer pattern 108a. An upper face of the preliminary contact tip 126 may be substantially higher than an upper face of the bit line contact 120. That is, the preliminary contact tip 126 may be protruded from the second sacrificial layer pattern 110a. The fourth conductive layer 124 may be etched by a dry etching process or a wet etching process.

Figure 15A:
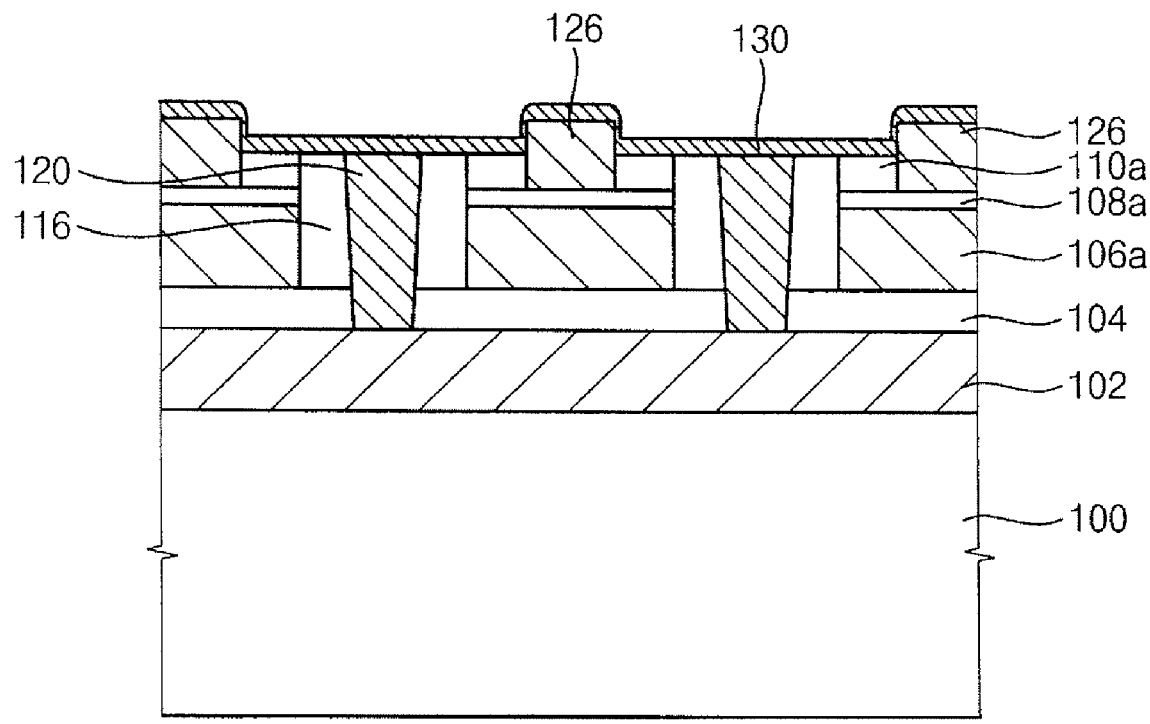
Figure 15B:
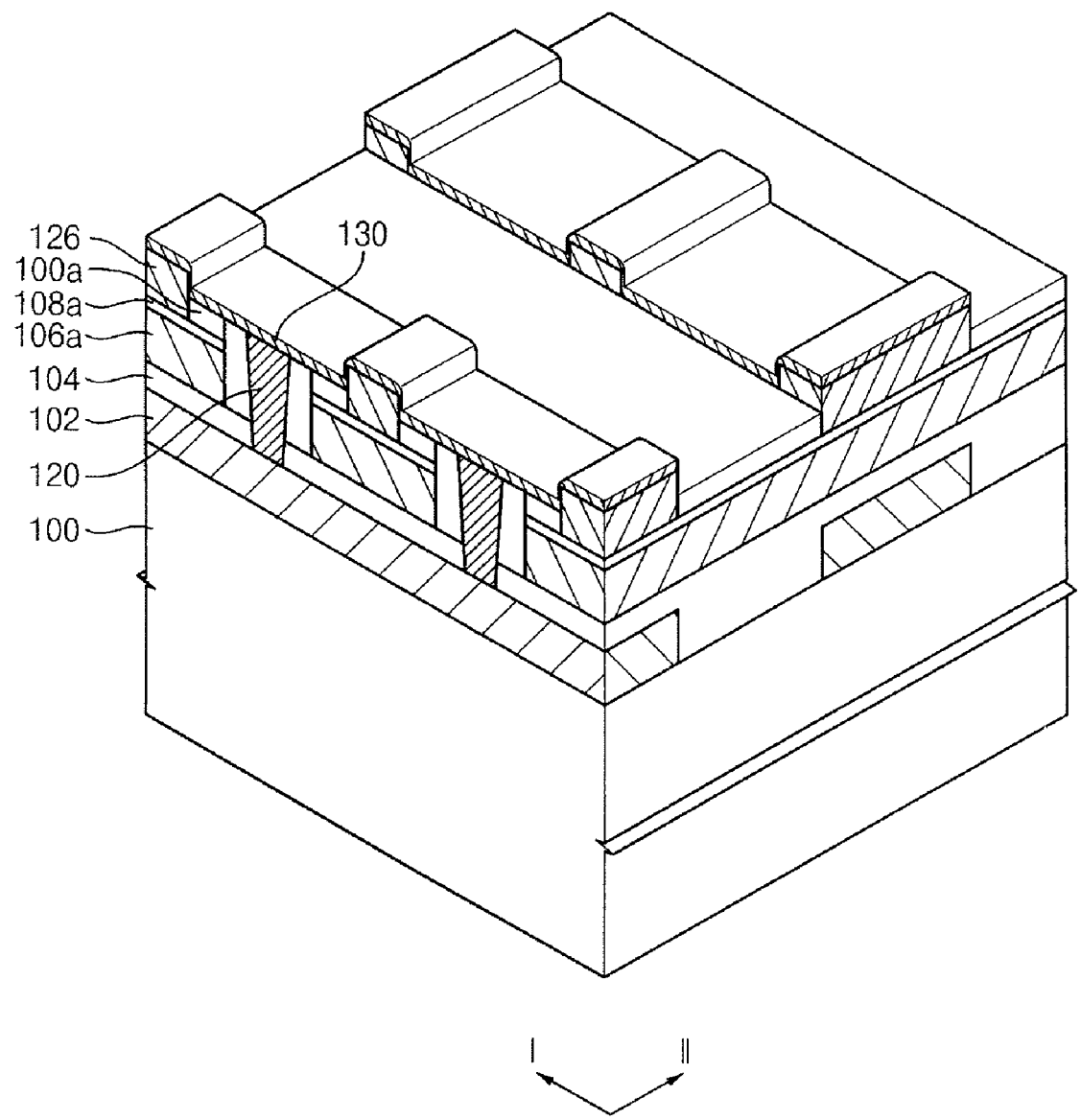

Referring to FIGS. 15A and 15B, a fifth conductive layer (not illustrated) is formed on the preliminary contact tip 126, a second sacrificial layer pattern 110a, the first insulating structure 116 and the bit line contact 120. A portion of the fifth conductive layer covering the preliminary contact tip 126 may be substantially higher then other portions of the fifth conductive layer. That is, the fifth conductive layer may have a protruding portion on the preliminary contact tip 126.

In an example embodiment, the fifth conductive layer may be formed using a conductive material having an elasticity to be bent by the electric filed around the contact tip 126a. For example, the fifth conductive layer may be formed using a carbon nanotube, a metal such as titanium, or a metal compound such as titanium silicide. The fifth conductive layer may be formed by a PVD process, a CVD process, an electric discharge process, etc. In an example embodiment, the fifth conductive layer may include a material substantially the same as the fourth conductive layer. Alternatively, the fourth and the fifth conductive layers may be formed using different materials, respectively.

An etching mask (not illustrated) is formed on the fifth conductive layer. The etching mask may have a line shape corresponding to the bit line 102. Then, the fifth conductive layer is etched using the etching mask to form a preliminary electrode 130. The preliminary electrode 130 may correspond to the bit line 102 and may extend along the first direction (I). The preliminary electrode 130 may also have a line shape.

Figure 16A:
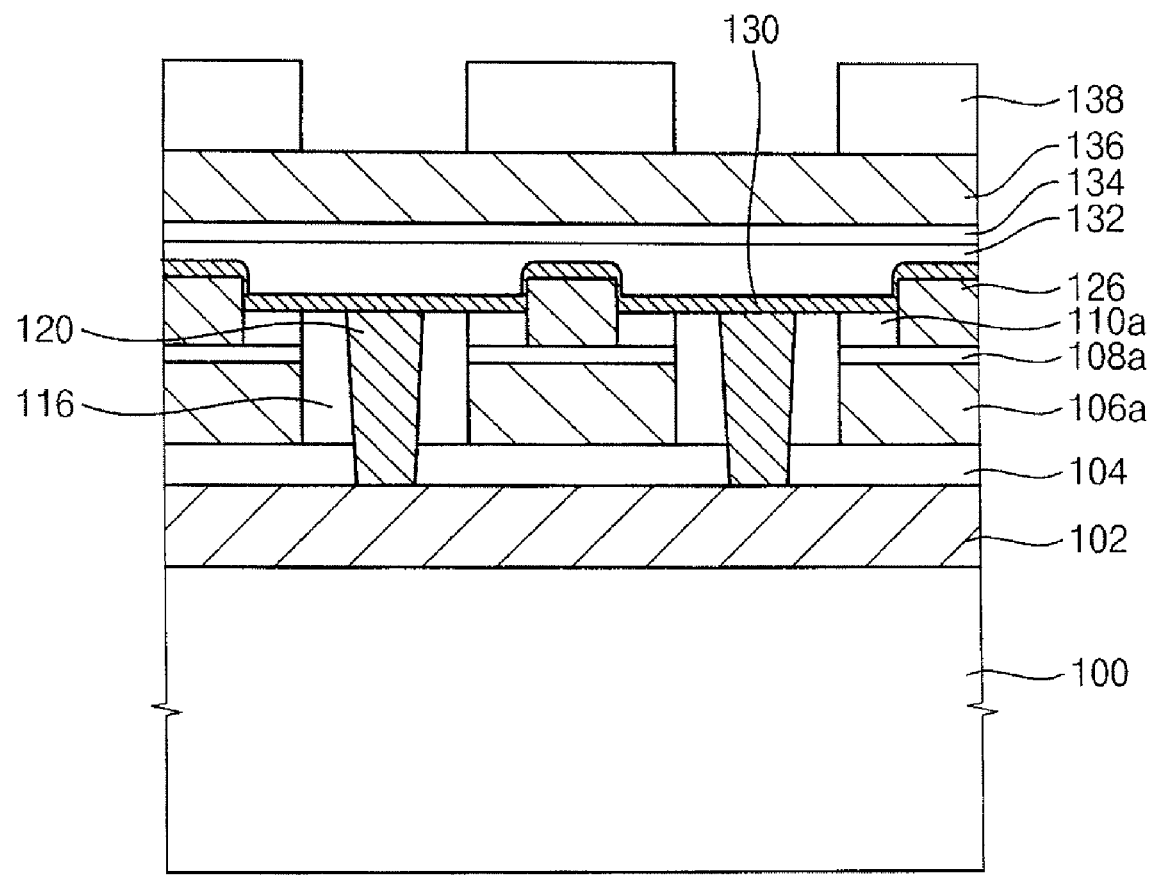
Figure 16B:
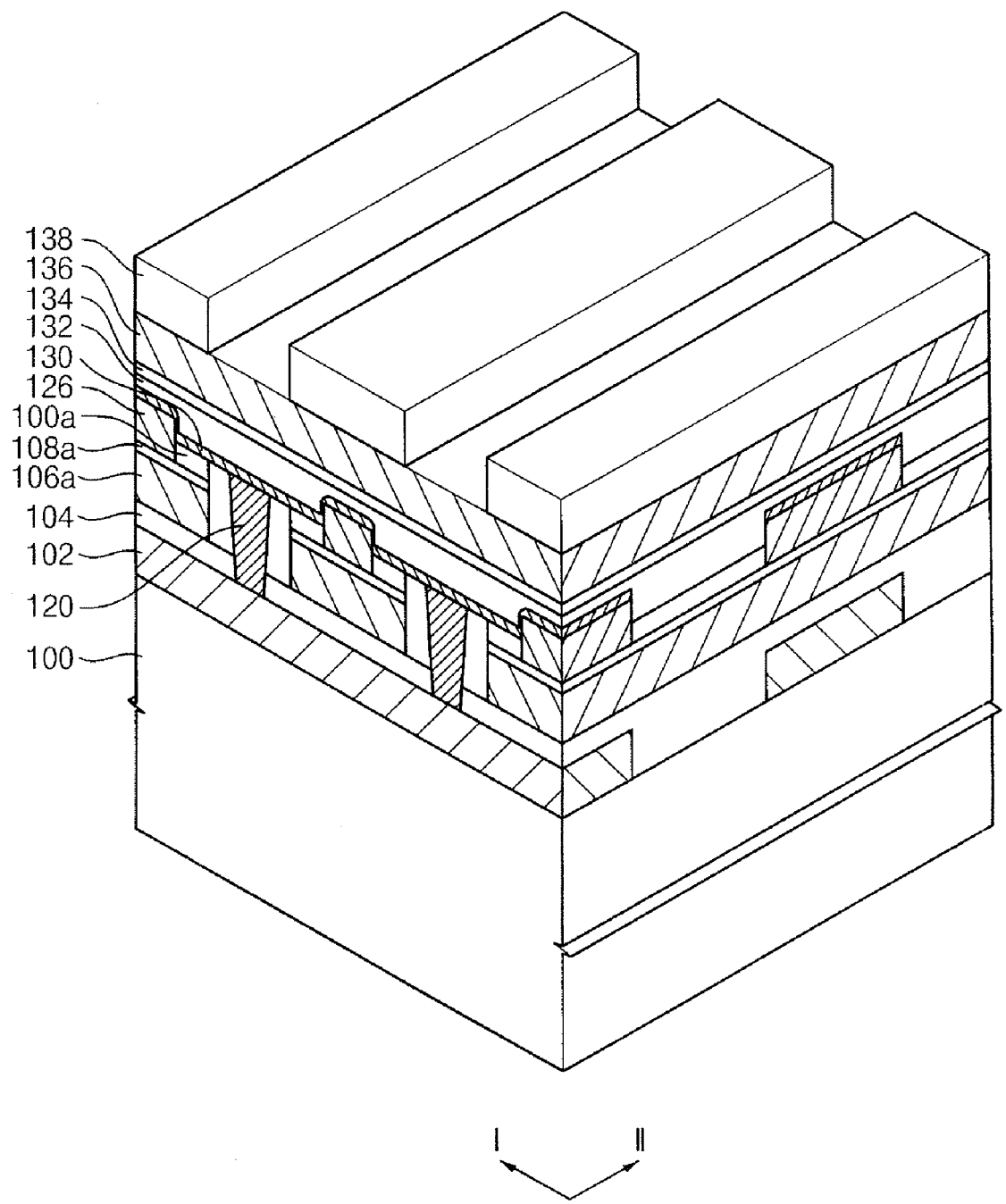

Referring to FIGS. 16A and 16B, a third sacrificial layer 132 is formed on the preliminary electrode 130 and the second sacrificial layer pattern 110a. The third sacrificial layer 132 may be formed using a material substantially the same as the second sacrificial layer pattern 110a. In an example embodiment, the second sacrificial layer pattern 110a and the third sacrificial layer 132 may include silicon germanium.

A fourth sacrificial layer 134 is formed on the third sacrificial layer 132. The fourth sacrificial layer 134 may be formed using a material substantially the same material as the first sacrificial layer pattern 108a. In an example embodiment, the first sacrificial layer pattern 108a and the fourth sacrificial layer 132 may include polysilicon. The fourth sacrificial layer 134 may protect a second word line 136a (see FIGS. 18A and 18B) in a successive wet etching process.

A sixth conductive 136 is formed on the fourth sacrificial layer 134. The sixth conductive layer 136 may be formed using a metal, a metal compound or polysilicon doped with impurities. For example, the sixth conductive layer 136 may be formed using aluminum, tungsten, titanium, tantalum, gold, silver, copper, tungsten silicide, titanium silicide, tantalum silicide, etc., used alone or in a combination thereof.

A third hard mask layer (not illustrated) is formed on the sixth conductive layer 136. The third hard mask layer may be formed using a nitride such as silicon nitride. The third hard mask layer is etched to form a third mask 138 corresponding to the first word line 106a. In an example embodiment, the third mask 138 may have a line shape.

Figure 17A:
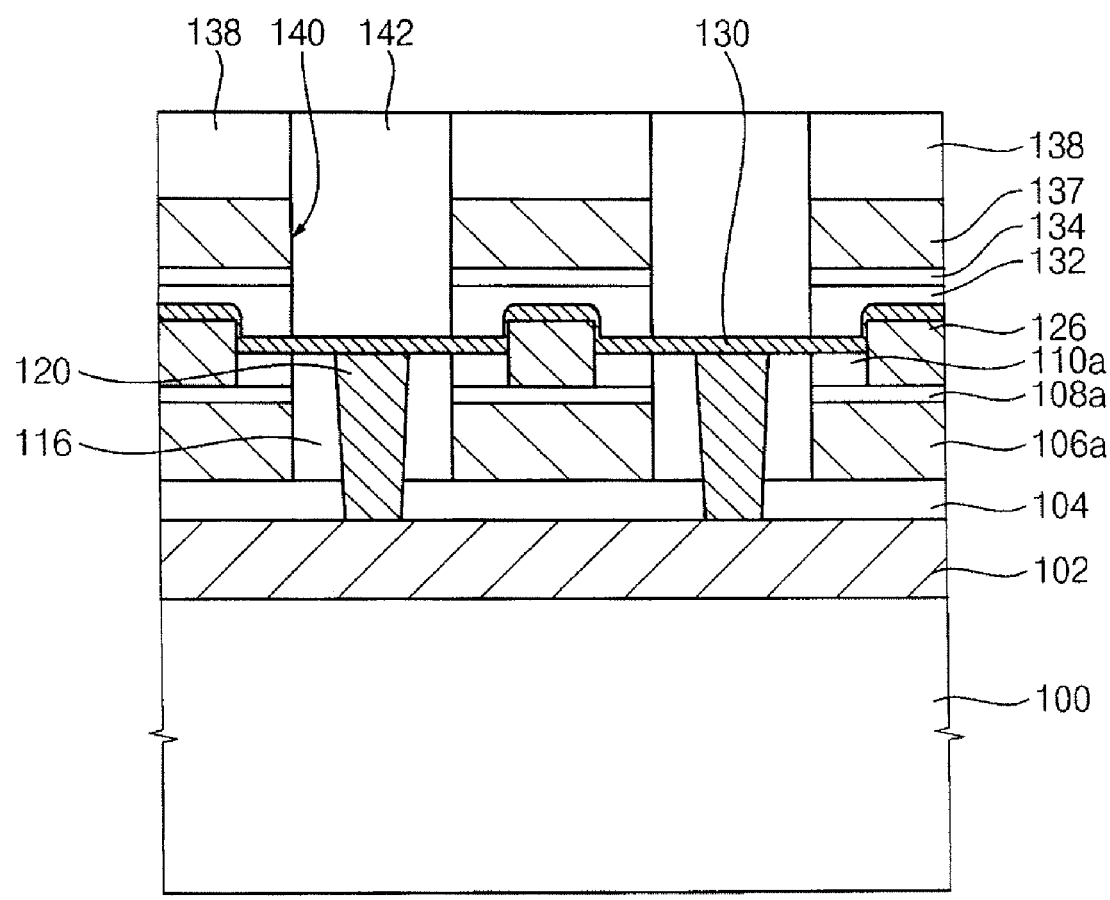
Figure 17B:
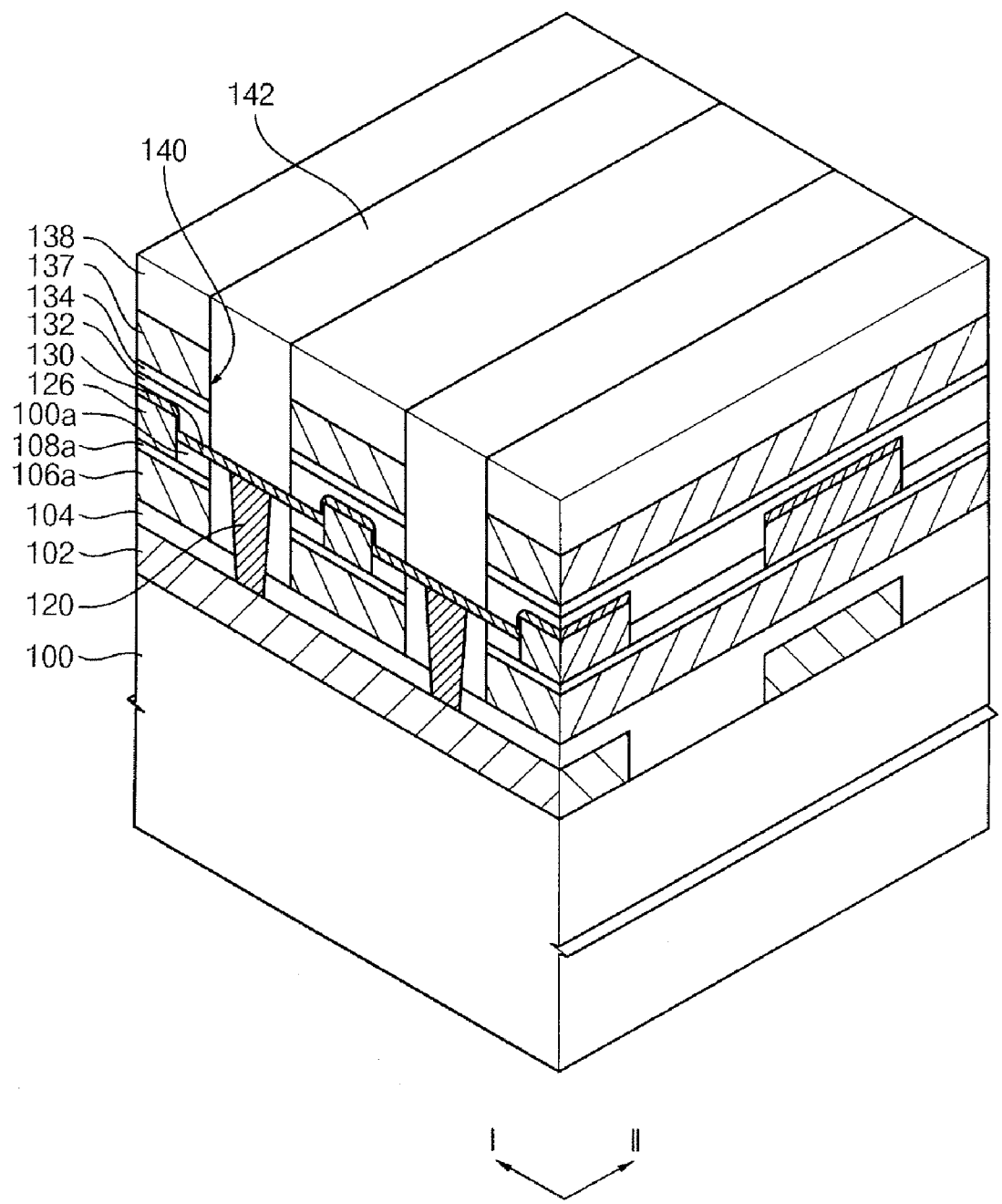

Referring to FIGS. 17A and 17B, the sixth conductive layer 136 (FIG. 16A), the fourth sacrificial layer 134 and the third sacrificial layer 132 are etched using the third hard mask 138 to form an opening 140 to expose the preliminary electrode 130. A preliminary second word line 137 extending along the second direction (II) is formed on the fourth sacrificial layer 134 after performing an etching process to form the opening 140.

A third insulation layer (not illustrated) is formed on the third hard mask 138 to fill up the opening 140. The third insulation layer may be formed using an oxide such as TEOS, USG, BPSG, PSG, FOX, SOG, HDP-CVD oxide, etc. The third insulation layer may be formed by a CVD process. Then, the third insulation layer is removed to expose the third hard mask 138 so that a third insulating interlayer 142 is formed on the preliminary electrode 130.

Figure 18B:
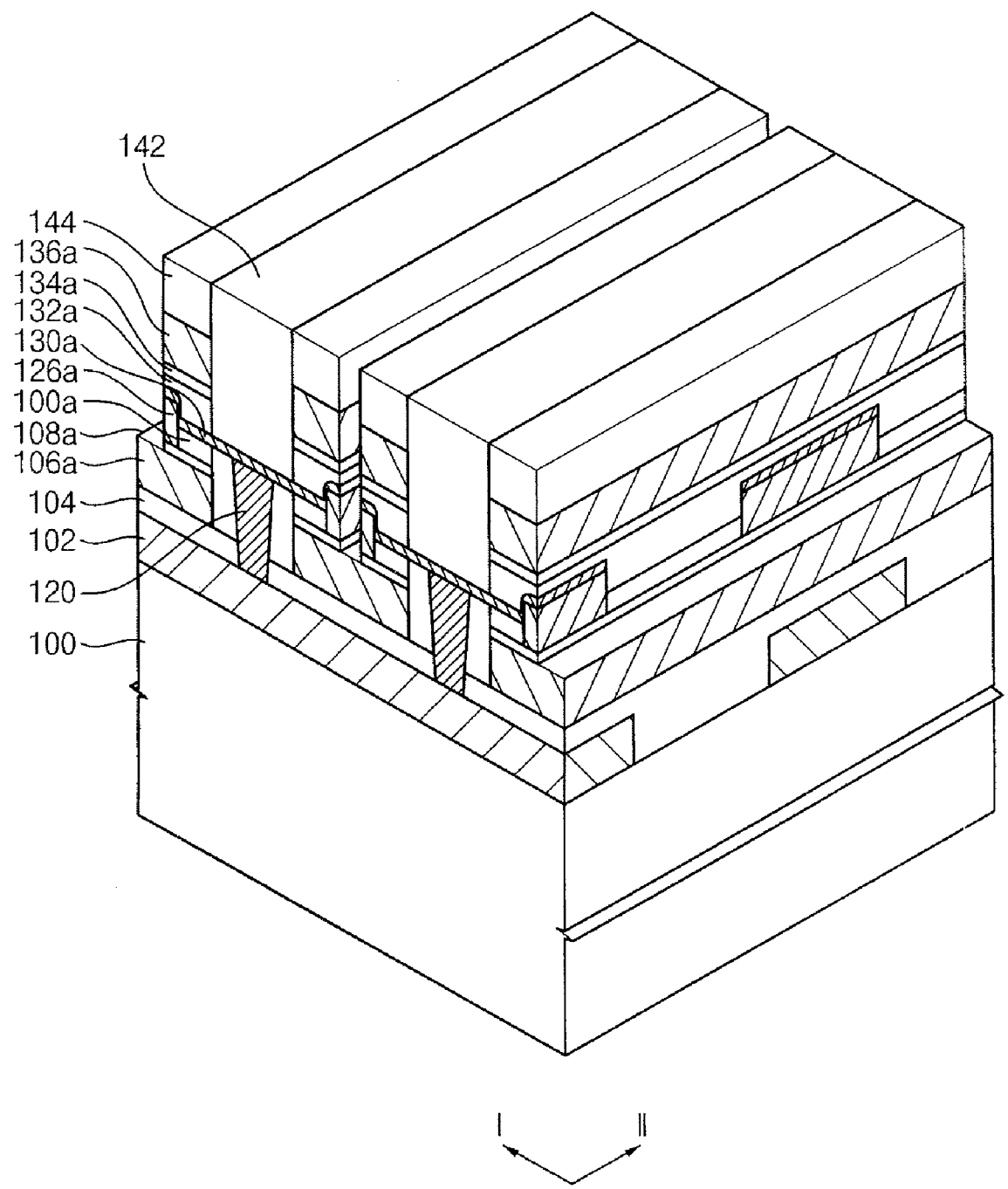

Referring to FIGS. 18A and 18B, the third hard mask 138 is patterned to form fourth hard masks 144. The fourth hard masks 144 may extend along the second direction (II) and may be substantially parallel to each other. That is, the third hard mask 138 having the line shape is partially etched to generate two of the fourth hard masks 144 having line shapes and extending in parallel.

The preliminary second word line 137, the fourth sacrificial layer 134, the third sacrificial layer 132, the preliminary electrode 130 and the preliminary contact tip 126 are etched using the fourth hard masks 144 as etching masks. Thus, one preliminary second word line 137 is divided into two second word lines 136a extending along the second direction (II). Additionally, the preliminary electrode 130 and the preliminary contact tip 126 are separated from each other to form the electrode 130a and the contact tip 126a. In an example embodiment, the second word line 136a, the electrode 130a and the contact tip 126a may be formed by an anisotropic etching process. The electrode 130a is electrically connected to the bit line contact 120. Both end portions of the electrode 130a are disposed between the first word line 106a and the second word line 136a. The contact tip 126a is formed at both end portions of the electrode 130a. The contact tip 126a may protrude toward the first word line 106a and the second word line 136a.

Figure 19A:
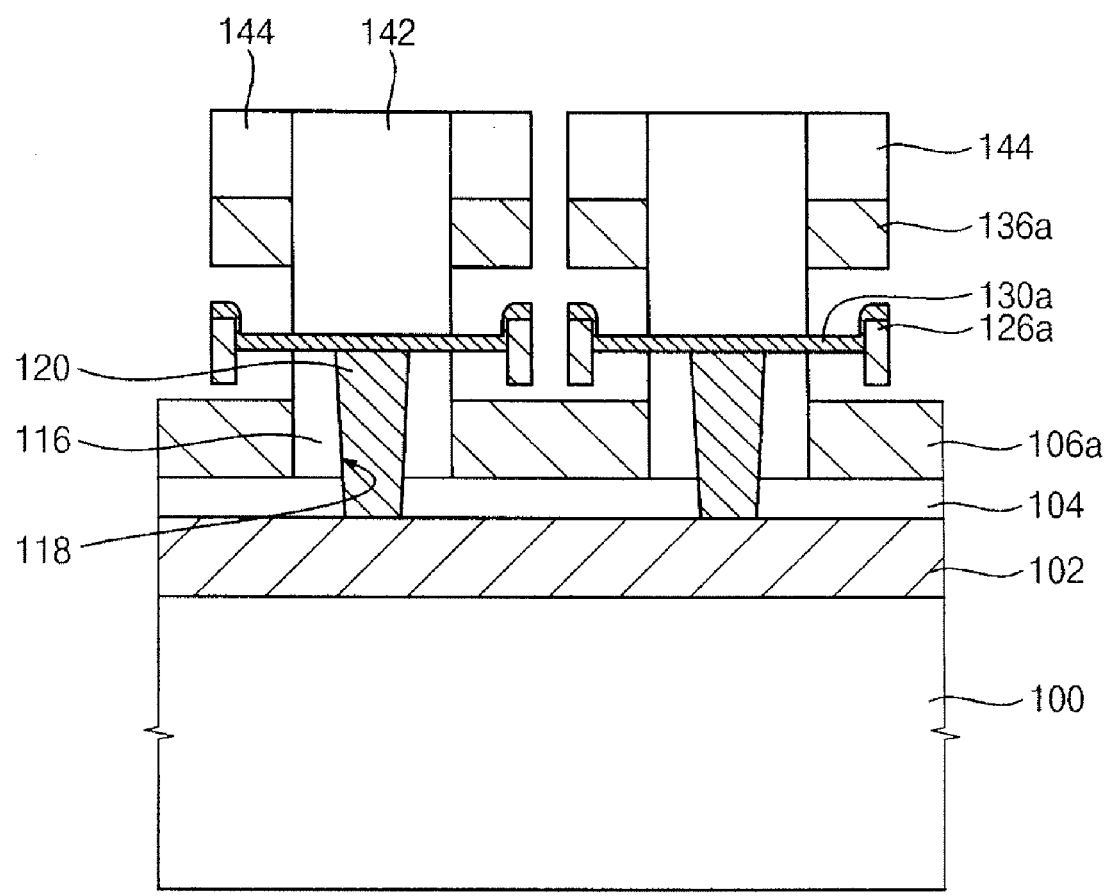
Figure 19B:
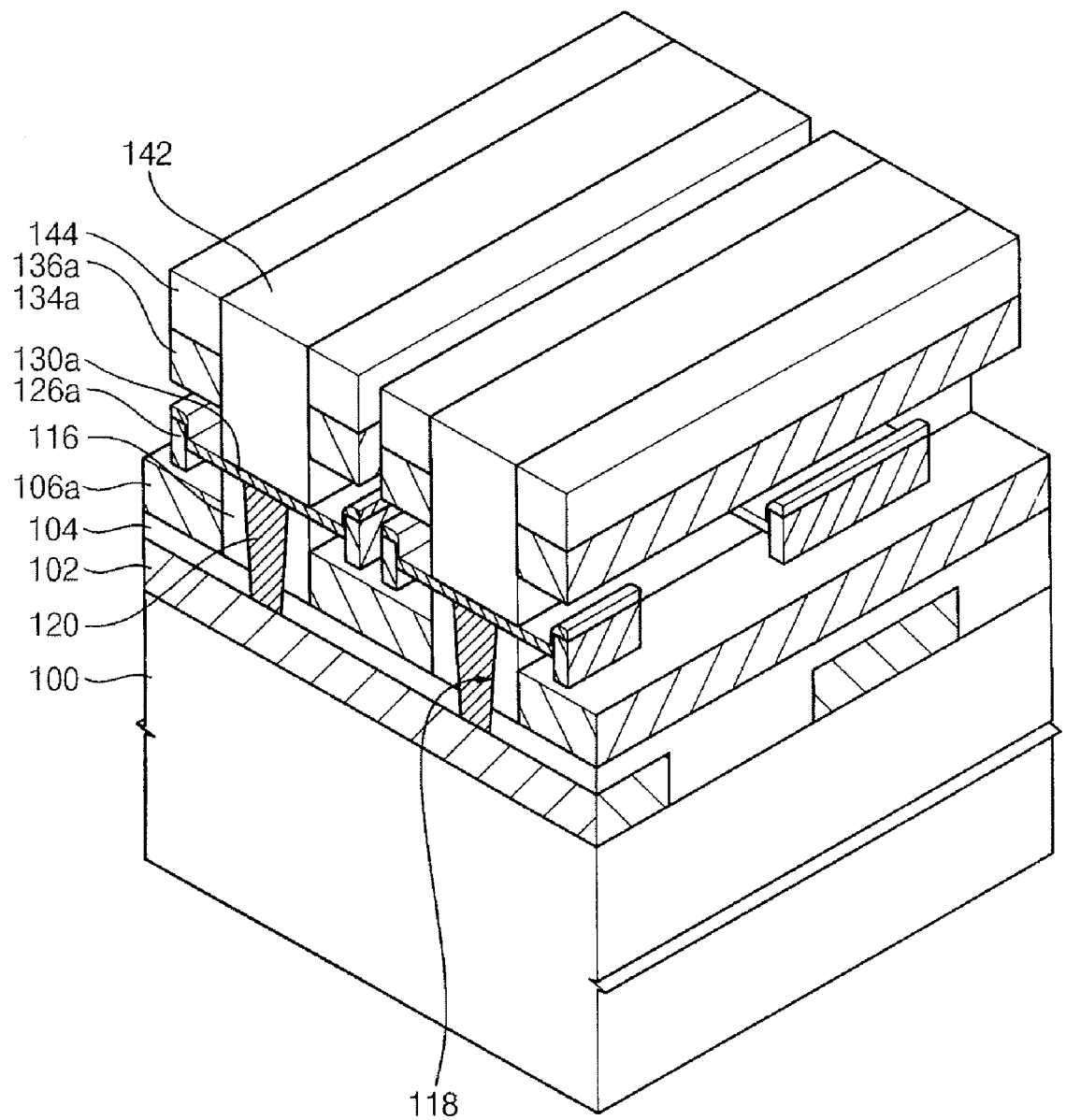

Referring to FIGS. 19A and 19B, the first, the second, the third and the fourth sacrificial layer patterns 108a, 110a, 132a and 134a exposed through an opening between adjacent second word lines 136a are removed. The first, the second, the third and the fourth sacrificial layer patterns 108a, 110a, 132a and 134a may be etched by a wet etching process. When the first, the second, the third and the fourth sacrificial layer pattern 108a, 110a, 132a and 134a are removed, the space is generated among the electrode 130a, the first word line 106a and the second word line 136a. Thus, the electrode 130a may be bent toward the first word line 106a or the second word line 136a in the space. Additionally, the contact tip 126a formed at the both end portions of the electrode 130a may make contact with the first word line 106a or the second word line 136a in accordance with a movement of the electrode 130a.

The electrode 130a is disposed on a plane spaced apart from the first word line 106a by a first distance and from the second word line 136a by a second distance. It is possible that the second distance is longer than the first distance. It is also possible that the first distance and the second distance are same. Here, a distal end of the electrode 130a and the contact tip 126a may form a single conductive contact tip. The conductive contact tip may have a first gap with the first word line 106a and a second gap with the second word line 136a. The conductive contact tip may have a thickness thicker than the lateral portion and a width narrower than the first and second word lines 160 and 136a.

In an example embodiment, an inactive gas may fill up the space among the electrode 130a, the first word line 106a and the second word line 136a. The inactive gas may include a nitrogen gas, a helium gas, an argon gas, etc. Alternatively, the space may be maintained in vacuum without the inactive gas.

In an example embodiment, an additional insulating interlayer (not illustrated) may be formed on the third insulating interlayer 142 and the fourth hard mask 144. The additional insulating interlayer may be formed between adjacent fourth hard masks 144. The contact tip 126a and the second word line 136a may not make contact with each other when the additional insulating interlayer has a lower face substantially lower than the second word line 136a. Thus, the additional insulating interlayer may have a lower face substantially higher than the second word line 136a. The additional insulating interlayer may separate the space between the first and the second word lines 106a and 136a from an outside.

In an example embodiment, an additional bit line, an additional first word line, an additional contact tip, an additional electrode and an additional second word line may be formed on the additional insulating interlayer by processes substantially the same as those described above to thereby manufacture a memory device having a plurality of memory cells as illustrated in FIG. 3.

Figure 20:
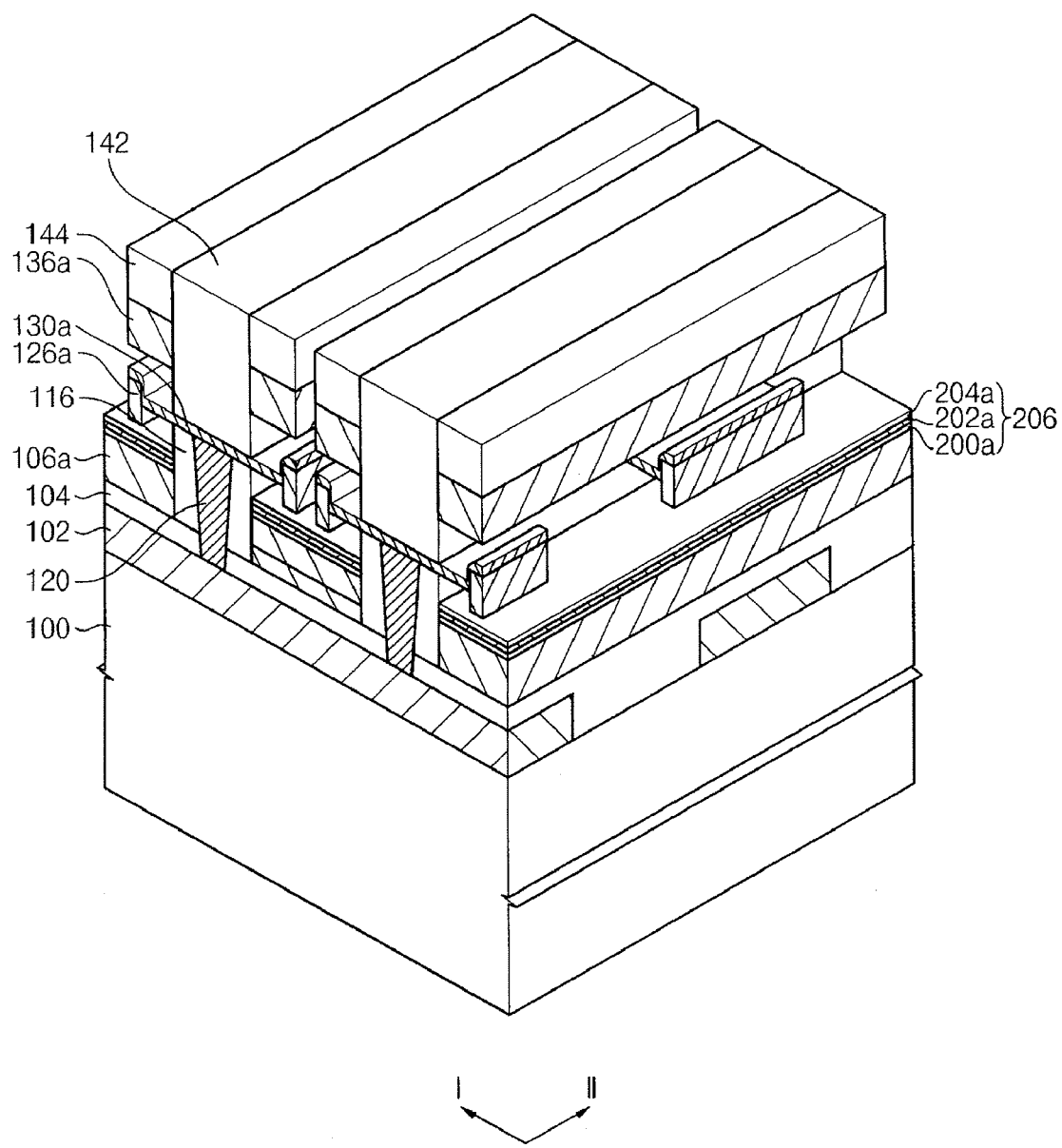
FIG. 20 is a perspective view illustrating a memory device in accordance with an example embodiment of the present general inventive concept.
Figure 21:
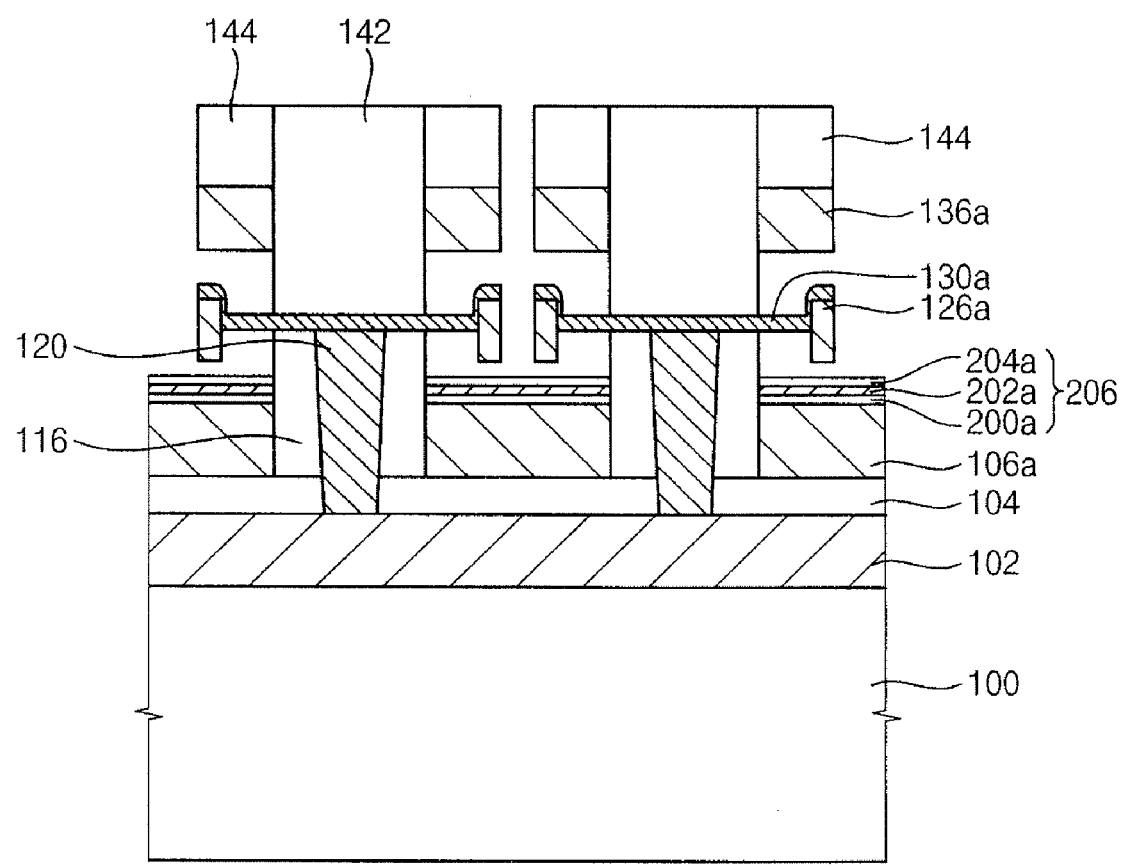
FIG. 21 is a cross-sectional view illustrating a memory device in accordance with an example embodiment of the present general inventive concept.

FIG. 20 is a perspective view illustrating a memory device in accordance with an example embodiment of the present general inventive concept. FIG. 21 is a cross-sectional view illustrating a memory device in accordance with an example embodiment of the present general inventive concept. In FIGS. 20 and 21, the memory device may have a construction substantially the same as or substantially similar to the memory device described with reference to FIGS. 1 and 2 except for a charge trapping structure 206. The charge trapping structure 206 includes an oxide layer pattern 200a, a charge trapping layer pattern 202a and a dielectric layer pattern 204a sequentially formed on a first word line 106a.

Referring to FIGS. 20 and 21, the memory device is provided on a substrate 100 having an insulation upper portion. The memory device includes a bit line 102, a first insulating interlayer 104, the first word line 106a, a second insulating interlayer 116, a bit line contact 120, the charge trapping structure 206, an electrode 130a, a contact tip 126a, a second word line 136a, a third insulating interlayer 142, and a hard mask 144.

The bit line 102 may extend on the substrate 100 along a first direction (I). The first insulating interlayer 104 is formed on the substrate 100 to cover the bit line 102. The first insulating interlayer 104 may sufficiently fill up a gap generated between adjacent bit lines 102.

The first word line 106a is formed on the first insulating interlayer 104. The first word line 106a may extend in a second direction (II) substantially perpendicular to the first direction (I). The first word line 106a may optionally serve as a writing word line or a reading word line. In an example embodiment, the first word line 106a may serve as the writing word line.

The charge trapping structure 206 is formed on the first word line 106a. As described above, the charge trapping structure 206 includes the oxide layer pattern 200a, the charge trapping layer pattern 202a and the dielectric layer pattern 204a. In an example embodiment, the oxide layer pattern 200a may include silicon oxide, and the charge trapping layer pattern 202a may include silicon nitride. Additionally, the dielectric layer pattern 204a may include metal oxide or silicon oxide. Charges may be trapped in the charge trapping layer pattern 202a.

The contact tip 126a and the electrode 130a may be bent towards the first word line 106a by the trapped charges in the charge trapping layer pattern 202a without continuously applying a voltage to the first word line 106a because the charges are trapped in the charge trapping layer pattern 202a. Thus, the memory device may serve as a non-volatile memory device.

The charge trapping structure 206 may be electrically connected to a word line to write data because the charge trapping structure 206 may maintain a contact state between the contact tip 126a and the word line to write data. Accordingly, the charge trapping structure 206 may be advantageously positioned on the first word line 106a.

The second insulating interlayer 116 is formed on the first insulating interlayer 104 between adjacent first word lines 106a to fill a gap between adjacent charge trapping structures 206. The second insulating interlayer 116 may have an upper face substantially higher than the first word line 106. That is, the second insulating interlayer 116 may be protruded from the first insulating interlayer 104 to ensure a height substantially higher than the first word line 106a.

A bit line contact hole 118 is formed through the second insulating interlayer 116 and the first insulating interlayer 104. The bit line contact hole 118 may partially expose the bit line 102. The bit line contact hole 118 may be formed between adjacent first word lines 106a. The bit line contact 120 is formed in the bit line contact hole 120. The bit line contact 120 is electrically connected to the bit line 102.

The electrode 130a is formed on the bit line contact 120 and the second insulating interlayer 116. The electrode 130a may include a conductive material having elasticity so that the electrode 130a may be bent in a predetermined direction by a voltage applied to the electrode 130a. In an example embodiment, at least one lateral portion of the electrode 130a may be bent toward the first word line 106a or the second word line 136a.

The second word line 136a is positioned over the electrode 130a. The second word line 136a may be separated from the electrode 130a by a predetermined distance. The hard mask 144 is formed on the second word line 136a. The third insulating interlayer 142 is formed on the electrode 130a. The third insulating interlayer 142 may fill a gap between adjacent second word lines 136a.

The contact tip 126a is formed at the lateral portion of the electrode 130a. The contact tip 126a may protrude toward the first and the second word lines 106a and 136a. The contact tip 126a may be selectively separated from the first and the second word lines 106a and 136 by predetermined intervals. The contact tip 126a may include a conductive material having elasticity. Thus, the lateral portion with the contact tip 126a may be bent in a predetermined direction by a voltage applied to the contact tip 126a.

When the contact tip 126 contacts the charge trapping structure 206, the contact tip 126 may electrically contact and is connected to the first word line 106a.

An operation of a memory device in accordance with example embodiments will be described as follows.

An attractive force is generated between the electrode 130a and the first word line 106a when opposite (+ and −) voltages are applied to the bit line 102 and the first word line 106a. The voltage is applied to the electrode 130a through the bit line 102. The contact tip 126a moves toward the charge trapping structure 206 by the attractive force. A voltage required to contact the contact tip 126a to the charge trapping structure 206 is referred to as a pull-in voltage (Vpull-in). The contact tip 126a and the charge trapping structure 206 make contact with each other so as to record data "0" in the memory device when the voltage more than the pull-in voltage is applied between the bit line 102 and the first word line 106a.

Meanwhile, a repulsive force is generated between the bit line 102 and the first word line 106a when a same (+ or −) voltage is applied to the bit line 102 and the first word line 106a. The voltage is applied to the electrode 130a through the bit line 102. The contact tip 126a moves toward the charge trapping structure 206 by the repulsive force. A voltage required to separate the contact tip 126a from the charge trapping structure 206 is referred to as a pull-out voltage (Vpull-out). The contact tip 126a and the charge trap structure 206 are separated from each other to record data "1" in the memory device when the pull-out voltage is applied between the bit line 102 and the first word line 106a. The pull-in voltage and the pull-out voltage may correspond to differences of voltages between the bit line 102 and the first word line 106a.

In an example embodiment, the contact tip 126a may stably make contact with the first word line 106a by charges stored in the charge trapping structure 206. A contact state between the contact tip 126a and the first word line 106a may be continuously maintained without applying an external voltage.

FIGS. 22 to 27 are cross-sectional views illustrating a method of manufacturing a memory device in accordance with example embodiments of the present general inventive concept. In FIGS. 22 to 27, the method of manufacturing the memory device may be substantially the same as, substantially similar to, or similar to the method described with reference to FIGS. 6A to 19B except a charge trapping structure 206.

Figure 22:
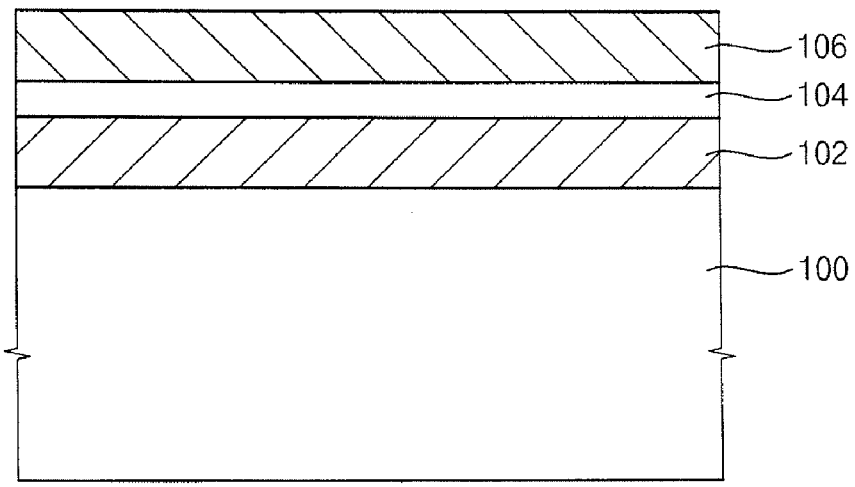
FIGS. 22 to 27 are cross-sectional views illustrating a method of manufacturing a memory device in accordance with example embodiments of the present general inventive concept.

Referring to FIG. 22, a substrate 100 having an insulation upper portion is provided, and then a first conductive layer (not illustrated) is formed on the substrate 100.

After an etching mask (not illustrated) is formed on the first conductive layer, the first conductive layer is etched using the etching mask to form a bit line 102 on the substrate 100. The bit line 102 may extend in a first direction (I).

An insulation layer (not illustrated) is formed on the bit line 102 to fill a gap between adjacent bit lines 102. The insulation layer may be formed using an oxide such as silicon oxide. Then, the insulation layer is planarized by a planarization process such as CMP process and/or an etch back process to form a first insulating interlayer 104 having a level upper face on the bit line 102. The planarization process may be finished before the bit line 102 is exposed so that the first insulating interlayer 104 may still cover the bit line 102.

A conductive layer 106 is formed on the first insulating interlayer 104. The first conductive layer 106 will be patterned to form a first word line 106a (see FIG. 25).

Figure 23:
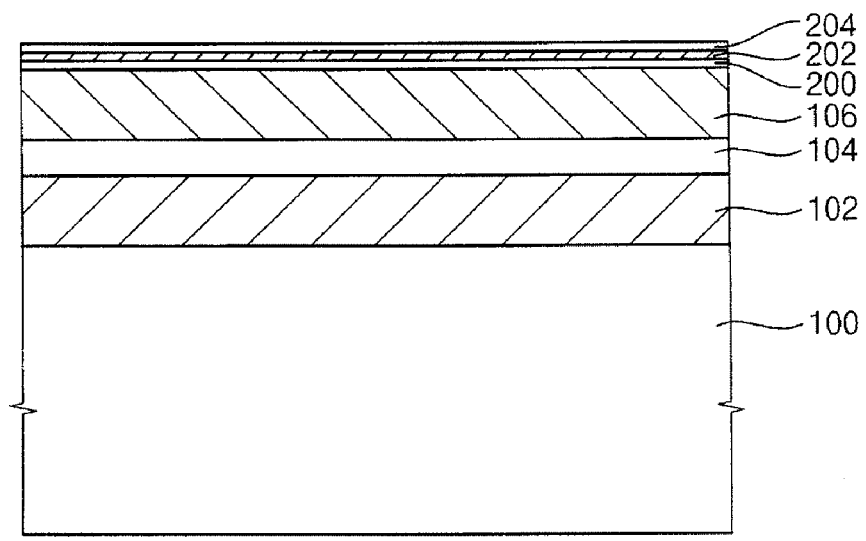

Referring to FIG. 23, an oxide layer 200, a charge trapping layer 202 and a dielectric layer 204 are successively formed on the first conductive layer 106. In an example embodiment, the oxide layer 200 may be formed using silicon oxide and the charge trapping layer 202 may be formed using silicon nitride. Additionally, the dielectric layer 204 may be formed using silicon oxide or metal oxide having a high dielectric constant. For example, the dielectric layer 204 may be formed using hafnium oxide ($HfO_x$), zirconium oxide ($ZrO_x$), aluminum oxide ($AlO_x$), tantalum oxide ($TaO_x$), etc.

Figure 24:
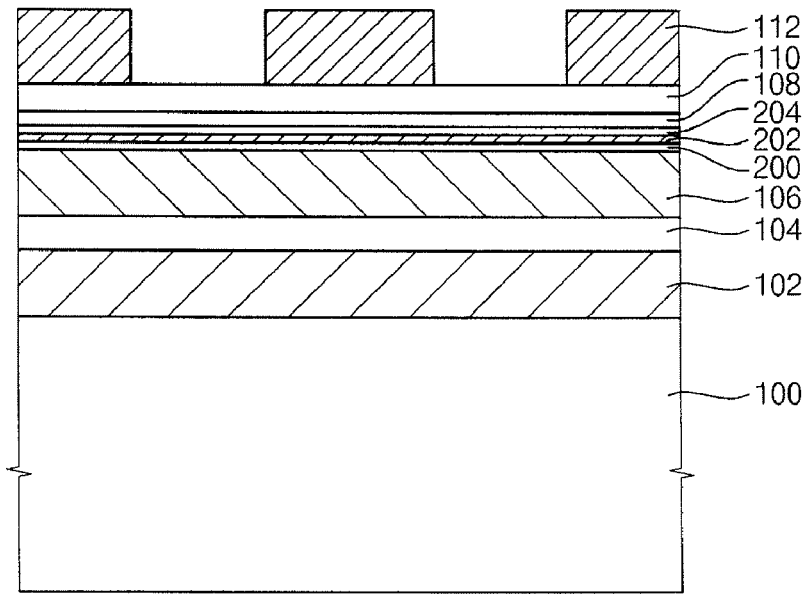

Referring to FIG. 24, a first sacrificial layer 108 and a second sacrificial layer 110 are sequentially formed on the dielectric layer 204. For example, the first sacrificial layer 108 may be formed using polysilicon, and the second sacrificial layer 110 may be formed using a silicon germanium.

A first hard mask 112 is formed on the second sacrificial layer 110. The first hard mask 112 may be formed using a nitride such as silicon nitride. The first hard mask 112 may have a line shape extending along a second direction (II) substantially perpendicular to the first direction (I).

Figure 25:
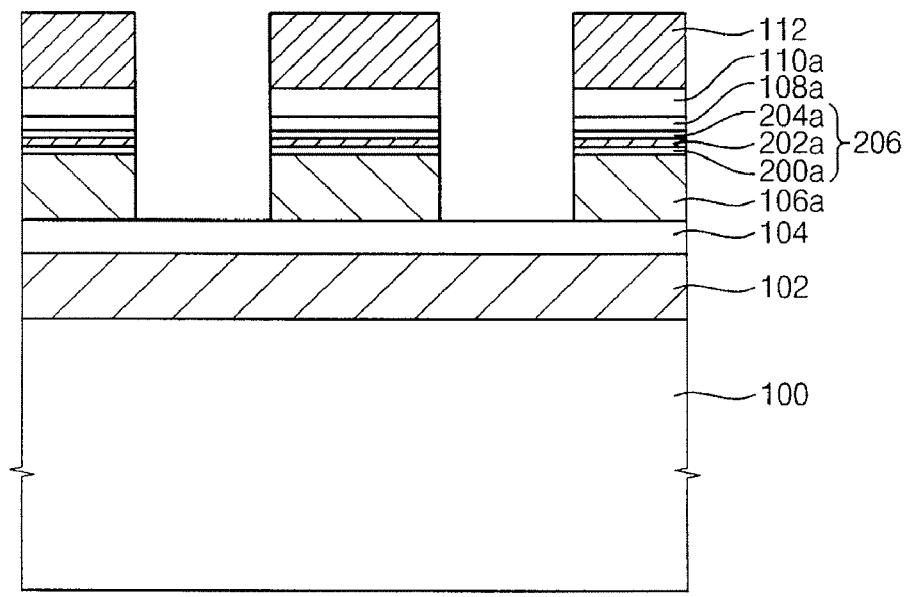

Referring to FIG. 25, the second sacrificial layer 110, the first sacrificial layer 108, the dielectric layer 204, the charge trapping layer 202, the oxide layer 200 and the first conductive layer 106 are etched using the first hard mask 112 as an etching mask. This etching process may include an anisotropic etching process. Thus, a first word line structure is formed on the substrate 100. The first word line structure includes a second sacrificial layer pattern 110a, a first sacrificial layer pattern 108a, the charge trapping structure 206 and the first word line 106a. Here, the charge trapping structure 206 includes a dielectric layer pattern 204a, a charge trapping layer pattern 202a and an oxide layer pattern 200a. The charge trapping structure 206 may include numerous charge trapping sites such that charges may be sufficiently trapped in the charge trapping structure 206. The first word line structure crossing over the bit line 102 may extend along the second direction (II). Additionally, the first word line structure may have a line shape. After a formation of the first word line structure, a portion of the first insulating interlayer 104 may be exposed between adjacent first word line structures.

In an example embodiment, a spacer may be formed on a sidewall of the first word line structure. The spacer may be formed using a nitride such as silicon nitride.

Figure 26:
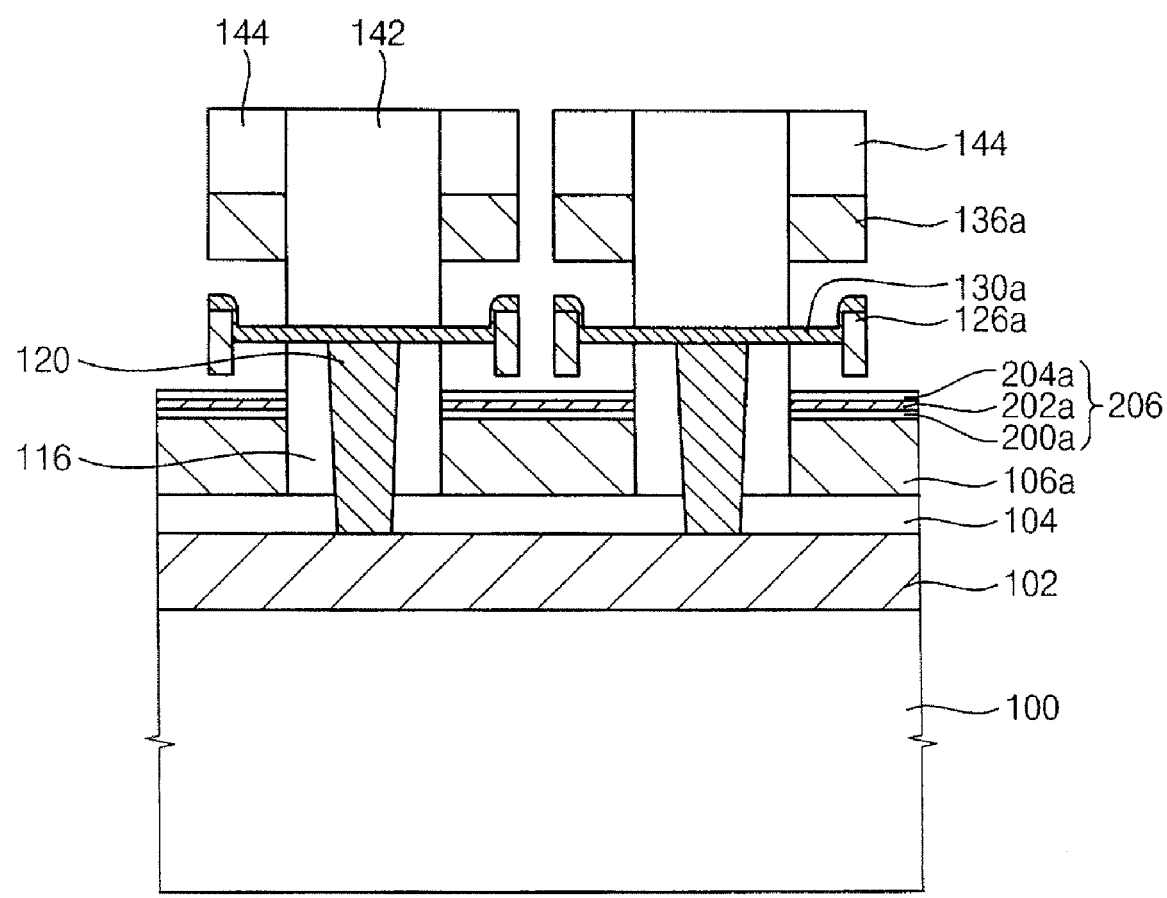

Referring to FIG. 26, a second insulating interlayer 116, a bit line contact 120, an electrode 130a, a contact tip 126a, a second word line 136a, a third insulating interlayer 142 and a second hard mask 144 are formed by processes substantially the same as or substantially similar to those described with reference to FIGS. 10A to 19B.

In an example embodiment, the second insulating interlayer 116 is formed on the first insulating interlayer 104 between adjacent first word line structures, and then the bit line contact 120 is formed through the second insulating interlayer 116 and the first insulating interlayer 104 by processes substantially the same as or substantially similar to the processes described with reference to FIGS. 10A to 11B. The bit line contact 120 makes contact with the bit line 102. After a dimple (not illustrated) is formed at a portion of the second sacrificial layer pattern 110a, the electrode 130a and the contact tip 126a are formed on the second insulating interlayer 116 by processes substantially the same as or substantially similar to the processes described with reference to FIGS. 12A to 19B. The electrode 130a is electrically connected to the bit line contact 120 and the contact tip 126a is formed at lateral portion of the electrode 130a. The contact tip 126a may protrude from an end portion of the electrode 130a. The second word line 136a is formed over the electrode 130a and the third insulating interlayer 142 is formed on the electrode 130a between adjacent second word lines 136a. The second word line 136a may be formed substantially in parallel to the first word line 106a. A space is provided between the second word line 136a and the charge trapping structure 206 by processes substantially the same as or substantially similar to the processes described with reference to FIGS. 19A and 19B. The electrode 130a and the contact tip 126a may be bent toward the second word line 136a or the charge trapping structure 206 in the space. The charge trapping structure 206 remains on the first word line 106a after a formation of the space.

Figure 27:
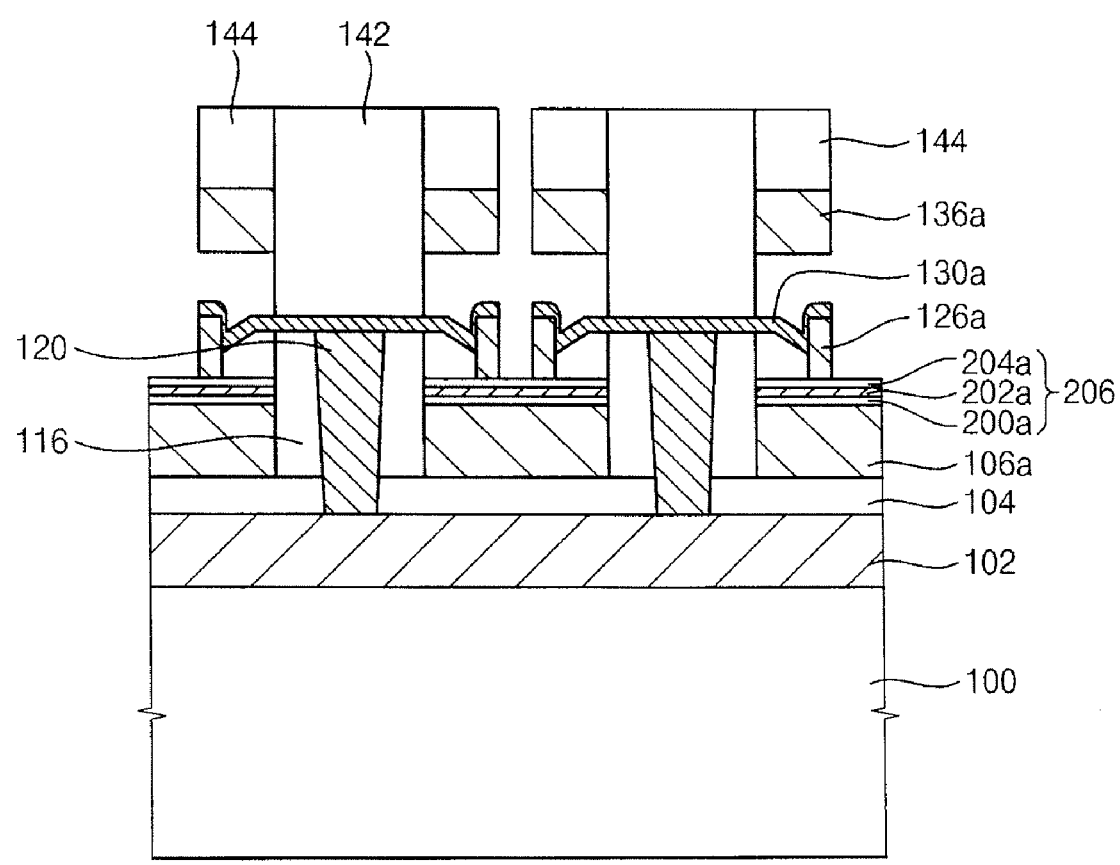

Referring to FIG. 27, a voltage difference between the first word line 106a and the bit line 120 is adjusted to make contact between the contact tip 126a and the first word line 106a. A predetermined voltage is applied to the contact tip 126a so as to inject charges into the charge trapping layer pattern 202a. A voltage difference between the first word line 106a and the bit line 120 is controlled to separate the contact tip 126a from the first word line 106a after sufficiently trapping the charges into the charge trapping layer pattern 202a.

In an example embodiment, an inactive gas may be filled in the space among the electrode 130a, the charge trapping structure 206 and the second word line 136a. The inactive gas may include a nitrogen gas, an argon gas, a helium gas, etc. Alternatively, the space may be maintained in a vacuum state.

In an example embodiment, an additional insulating interlayer may be formed on the third insulating interlayer 142 and the second hard mask 144. The additional insulating interlayer may have a lower face substantially higher than the second word line 136a. The additional insulating interlayer may separate the space between the first and the second word lines 106a and 136a from an outside.

An additional bit line, an additional first word line, an additional contact tip, an additional electrode and an additional second word line may be formed on the additional insulating interlayer, so that the memory device may include a lower memory unit and an upper memory unit as described above.

According to various embodiments of the present general inventive concept, a contact tip may be provided on at least one lateral portion of an electrode such that a distance between a first word line and a second word line may be reduced. Therefore, a memory device having the electrode and the contact tip may operate at a low voltage, and thus memory device may have low power consumption. Additionally, a charge trapping structure may be provided on the first word line so as to maintain a contact state between the contact tip and the first word line by trapping charges in the charge trapping structure. Thus, data recorded in the first word line may be not erased without applying a voltage to the first word line. Accordingly, the memory device may serve as a nonvolatile memory device.

Although various embodiments of the present general inventive concept have been illustrated and described, it will be appreciated by those skilled in the art that changes may be made in these embodiments without departing from the principles and spirit of the general inventive concept, the scope of which is defined in the appended claims and their equivalents.

What is claimed is:

1. A memory device, comprising:
a first conductive line disposed on a substrate;
a second conductive line disposed over the first conductive line, the second conductive line being electrically insulated from the first conductive line;
a contact electrically connected to the first conductive line, the contact having an upper face substantially higher than the second conductive line;
an electrode electrically connected to the contact, the electrode having at least one lateral portion extending in parallel to the second conductive line and the electrode including an elastic material to be bent by an electric field;
a third conductive line disposed over the electrode, the third conductive line corresponding to the first and the second conductive lines; and
a contact tip disposed at the lateral portion of the electrode, the contact tip protruding toward the second and the third conductive lines.

2. The memory device of claim 1, further comprising:
a first insulating interlayer formed between the first conductive line and the second conductive line.

3. The memory device of claim 2, further comprising:
a second insulating interlayer formed on the first insulating interlayer between adjacent second conductive lines.

4. The memory device of claim 1, further comprising:
a charge trapping structure disposed on the second conductive line,
wherein the charge trapping structure includes an oxide layer pattern, a charge trapping layer pattern and a dielectric layer pattern.

5. The memory device of claim 1, wherein:
the first conductive line comprises a bit line extending on a substrate along a first direction;
the second conductive line comprises a first word line formed over the bit line along a second direction substantially perpendicular to the first direction;
the contact comprises a bit line contact formed on the bit line between adjacent first word lines;
the electrode is formed on the bit line contact;
the third conductive line comprises a second word line formed over the electrode, the second word line extending along the second direction; and
the contact tip is formed at the lateral portion of the electrode.

6. The memory device of claim 5, further comprising:
a first insulating interlayer formed between the bit line and at least one of the first word lines.

7. The memory device of claim 6, further comprising:
a second insulating interlayer formed on the first insulating interlayer between adjacent first word lines.

8. The memory device of claim 7, further comprising:
a third insulating interlayer formed on the electrode between adjacent second word lines.

9. The memory device of claim 5, wherein two of the second word lines are formed and aligned over one of the first word lines.

10. The memory device of claim 5, wherein two of the contact tips are formed at both lateral portions of the electrode.

11. The memory device of claim 5, wherein the contact tip and the electrode include at least one selected from the group consisting of titanium, titanium nitride and carbon nanotube.

12. The memory device of claim 5, further comprising:
a charge trapping structure formed on the first word line wherein the charge trapping structure includes an oxide layer pattern, a charge trapping layer pattern and a dielectric layer pattern.

13. A method of manufacturing a memory device, the method comprising:
forming a first conductive line on a substrate;
forming a second conductive line over the first conductive line, wherein the second conductive line is electrically insulated from the first conductive line;
forming a contact on the first conductive line, wherein the contact has an upper face substantially higher than the second conductive line;
forming an electrode on the contact, wherein the electrode has at least one lateral portion extending in parallel to the second conductive line and the electrode includes an elastic material to be bent by an electric field;
forming a contact tip at the lateral portion of the electrode, wherein the contact tip protrudes from the lateral portion of the electrode; and
forming a third conductive line over the electrode, wherein the third conductive line corresponds to the first and the second conductive lines.

14. The method of claim 13, further comprising:
forming a first insulating interlayer between the first conductive line and the second conductive line.

15. The method of claim 14, further comprising:
forming a second insulating interlayer on the first insulating interlayer between adjacent second conductive lines.

16. The method of claim 13, further comprising:
forming a charge trapping structure on the second conductive line,
wherein forming the charge trapping structure comprises:
 forming an oxide layer pattern on the second conductive line;
 forming a charge trapping layer pattern on the oxide layer pattern; and
 forming a dielectric layer pattern on the charge trapping layer pattern.

17. The method of claim 13, wherein:
the forming of the first conductive line comprises forming a bit line on the substrate along a first direction;
the forming of the second conductive line comprises forming a first word line over the bit line, wherein the first word line extends along a second direction substantially perpendicular to the first direction;
the forming of the contact comprises forming a bit line contact on the bit line between adjacent first word lines, wherein the bit line contact has an upper face substantially higher than the first word lines;
the forming of the electrode comprises forming the electrode on the bit line contact, wherein the electrode includes an elastic material bending by an electric field and the electrode has at least one lateral portion substantially in parallel to at least one of the first word lines; and
the forming of the third conductive line comprises forming a second word line over the electrode along the second direction.

18. The method of claim 17, further comprising:
forming a first insulating interlayer between the bit line and at least one of the first word lines.

19. The method of claim 18, further comprising:
forming a first sacrificial layer pattern and a second sacrificial layer pattern on at least one of the first word lines.

20. The method of claim 19, further comprising:
forming a second insulating interlayer on the first insulating interlayer between adjacent first word lines,
wherein the second insulating interlayer has an upper face substantially higher than the first word line.

21. The method of claim 20, further comprising:
forming a dimple at a portion of the second sacrificial layer pattern; and
forming a preliminary contact tip protruding from the dimple.

22. The method of claim 21, further comprising:
forming a third sacrificial layer on the preliminary contact tip and the electrode;
forming a fourth sacrificial layer on the third sacrificial layer;
forming a conductive layer for the second word line on the fourth sacrificial layer;
partially removing the conductive layer, the fourth sacrificial layer and the third sacrificial layer to form an opening; and
forming a third insulating interlayer in the opening.

23. The method of claim 22, wherein forming the second word line and forming the contact tip further comprises:
partially removing the conductive layer from a central portion of the preliminary contact tip to form a second word line over the electrode;
removing the third and the fourth sacrificial layers; and
partially removing the preliminary contact tip to form the contact tip.

24. The method of claim 23, further comprising:
removing the third and the fourth sacrificial layers after forming the contact tip.

25. The method of claim 17, further comprising
forming an oxide layer pattern on at least one of the first word lines;
forming a charge trapping layer pattern on the oxide layer pattern; and
forming a dielectric layer pattern on a charge trapping layer pattern.

26. A memory device, comprising:
a bit line extending in one direction on a substrate;
a conductive word line extending in a second direction perpendicular to the one direction;
an other conductive word line disposed over the conductive word line;
an electrode having a lateral portion disposed in a gap between the conductive word line and the other conductive word line to receive a charge from the bit line and to generate an electrical field with at least one of the conductive word line and the other conductive word line such that the lateral portion is bent toward the electrical field to program data bits in the memory device; and
a contact tip formed on a distal end of the lateral portion of the electrode, the contact tip having a thickness thicker than the lateral portion and spaced apart from the first conductive word line by a first distance and from the other conductive word line by a second distance.

27. The memory device of claim 26, where in the contact tip moves to electrically contact one of the conductive word line and the other conductive word line according to a bending of the lateral portion.

28. The memory device of claim 26, further comprising:
a substrate;
a bit line formed on the substrate in a first direction; and
a contact disposed between the electrode and the bit line to electrically connect the electrode and the bit line,
wherein the conductive word line is a first word line, the other conductive word line is a second word line, the lateral portion moves to be electrically connected to one of the first word line and the second word line according to the electrical field.

29. The memory device of claim 26, wherein the lateral portion is extended from a center portion of the electrode spaced apart from the conductive word line by a first distance and from the other conductive word line by a second distance.

30. The memory device of claim 29, wherein the lateral portion is bent with respect to the center portion.

31. A method of manufacturing a memory device, the method comprising:
forming a bit line extending in one direction on a substrate;
forming a conductive word line extending in a second direction perpendicular to the one direction;
forming an other conductive word line to be disposed over the conductive word line to form an electrical field;
forming an electrode having a lateral portion disposed in a gap between the conductive word line and the other conductive word line to receive a charge from the bit line and to generate the electrical field with at least one of the conductive word line and the other conductive word line such that the lateral portion is bent by the electrical field to program data bits in the memory device; and
forming a contact tip on a distal end of the lateral portion of the electrode, the contact tip formed to have a thickness thicker than the lateral portion, and spaced apart from the first conductive word line by a first distance and from the other conductive word line by a second distance.

* * * * *